US012389566B2

(12) United States Patent
McManis et al.

(10) Patent No.: US 12,389,566 B2
(45) Date of Patent: Aug. 12, 2025

(54) MULTI-RACK IMMERSION COOLING DISTRIBUTION SYSTEM

(71) Applicant: Green Revolution Cooling, Inc., Austin, TX (US)

(72) Inventors: Alex David McManis, Austin, TX (US); James John Boyd, Austin, TX (US); David Nathan Senecal, Austin, TX (US)

(73) Assignee: Green Revolution Cooling, Inc., Austin, TX (US)

( * ) Notice: Subject to any disclaimer, the term of this patent is extended or adjusted under 35 U.S.C. 154(b) by 0 days.

(21) Appl. No.: 17/523,403

(22) Filed: Nov. 10, 2021

(65) Prior Publication Data

US 2022/0151097 A1 May 12, 2022

Related U.S. Application Data

(60) Provisional application No. 63/119,771, filed on Dec. 1, 2020, provisional application No. 63/112,745, filed on Nov. 12, 2020.

(51) Int. Cl.
*H05K 7/20* (2006.01)
(52) U.S. Cl.
CPC ..... *H05K 7/20236* (2013.01); *H05K 7/20272* (2013.01); *H05K 7/20781* (2013.01)
(58) Field of Classification Search
CPC ........... H05K 7/20236; H05K 7/20272; H05K 7/20781; H05K 7/2079; H05K 7/20763;
(Continued)

(56) References Cited

U.S. PATENT DOCUMENTS

| 1,093,951 A | 4/1914 | Steinberger |
| 1,606,025 A | 11/1926 | Gruendler |

(Continued)

FOREIGN PATENT DOCUMENTS

| AU | 2009282170 B2 | 11/2014 |
| CN | 101443724 A | 5/2009 |

(Continued)

OTHER PUBLICATIONS

Korean Intellectual Property Office, International Search Report and Written Opinion in International Application No. PCT/US2021/058991, mailed Mar. 3, 2022 (10 pages).

(Continued)

*Primary Examiner* — Jayprakash N Gandhi
*Assistant Examiner* — Matthew Sinclair Muir
(74) *Attorney, Agent, or Firm* — Greenberg Traurig, LLP

(57) ABSTRACT

Various aspects include devices, systems, and methods for multi-tank immersion cooling distribution. The devices and systems may include a coolant distribution unit, a coolant manifold, a supply and return line, and one or more immersion cooling racks. The coolant distribution unit may be configured to adjust a temperature and pump a fluid used as a coolant. The coolant manifold may redistribute the fluid. The immersion cooling racks may be disposed between the coolant distribution unit and the coolant manifold. Each immersion cooling rack may be coupled to the coolant manifold through an inlet duct for receiving the fluid from the coolant manifold and an outlet duct for returning the fluid to the coolant manifold.

12 Claims, 11 Drawing Sheets

(58) Field of Classification Search
CPC .............. H05K 7/208; H05K 7/20827; H05K 7/20709; H05K 7/20627; H05K 7/20654; H05K 7/2069
See application file for complete search history.

(56) References Cited

U.S. PATENT DOCUMENTS

| | | | |
|---|---|---|---|
| 2,440,930 A | | 5/1948 | Guglielmo et al. |
| 2,525,457 A | | 10/1950 | Paluev |
| 2,643,282 A | | 6/1953 | Greene |
| 3,094,133 A | | 6/1963 | Treanor |
| 3,320,762 A | | 5/1967 | Murdoch |
| 3,406,244 A | | 10/1968 | Oktay |
| 3,450,265 A | | 6/1969 | Kreusch et al. |
| 3,489,207 A | | 1/1970 | Miller |
| 3,600,636 A | | 8/1971 | Petersen |
| 3,754,741 A | | 8/1973 | Whitehurst et al. |
| 3,858,090 A | | 12/1974 | Lehmann |
| 4,034,335 A | * | 7/1977 | Harazoe ............... F16D 66/022 340/459 |
| 4,245,668 A | | 1/1981 | Lindstrom |
| 4,302,793 A | | 11/1981 | Rohner |
| 4,313,310 A | | 2/1982 | Kobayashi et al. |
| 4,372,632 A | | 2/1983 | Villa et al. |
| 4,399,501 A | | 8/1983 | Masselin |
| 4,460,008 A | | 7/1984 | O'Leary et al. |
| 4,464,315 A | | 8/1984 | O'Leary |
| 4,493,010 A | | 1/1985 | Morrison et al. |
| 4,590,538 A | | 5/1986 | Cray, Jr. |
| 4,600,230 A | | 7/1986 | Yoji et al. |
| 4,648,043 A | | 3/1987 | O'Leary |
| 4,659,459 A | | 4/1987 | O'Leary et al. |
| 4,704,658 A | | 11/1987 | Yokouchi et al. |
| 4,722,577 A | | 2/1988 | Mewborne |
| 4,741,385 A | | 5/1988 | Bergles et al. |
| 4,834,257 A | | 5/1989 | Book et al. |
| 5,102,503 A | | 4/1992 | Silinski et al. |
| 5,145,585 A | | 9/1992 | Coke |
| 5,260,850 A | | 11/1993 | Sherwood et al. |
| 5,294,916 A | | 3/1994 | Bolton et al. |
| 5,297,621 A | | 3/1994 | Taraci et al. |
| 5,329,418 A | | 7/1994 | Tanabe |
| 5,332,494 A | | 7/1994 | Eden et al. |
| 5,414,591 A | | 5/1995 | Kimura et al. |
| 5,574,627 A | | 11/1996 | Porter |
| 5,655,459 A | | 8/1997 | O'Connor et al. |
| 5,851,143 A | | 12/1998 | Hamid |
| 5,907,473 A | | 5/1999 | Przilas et al. |
| 6,019,167 A | | 2/2000 | Bishop et al. |
| 6,374,627 B1 | | 4/2002 | Schumacher et al. |
| D477,617 S | | 7/2003 | Resch |
| 6,600,656 B1 | | 7/2003 | Mori et al. |
| 6,616,851 B1 | | 9/2003 | Sforza-Heinen et al. |
| 6,621,707 B2 | | 9/2003 | Ishimine et al. |
| D483,045 S | | 12/2003 | Resch |
| 6,909,606 B2 | | 6/2005 | Barsun et al. |
| 7,086,247 B2 | | 8/2006 | Campbell et al. |
| D530,346 S | | 10/2006 | Resch |
| 7,184,269 B2 | | 2/2007 | Campbell et al. |
| 7,210,304 B2 | | 5/2007 | Nagashima et al. |
| 7,278,273 B1 | | 10/2007 | Whitted et al. |
| 7,307,841 B2 | | 12/2007 | Berlin et al. |
| 7,318,322 B2 | | 1/2008 | Ota et al. |
| 7,403,392 B2 | | 7/2008 | Attlesey et al. |
| 7,413,394 B2 | | 8/2008 | Risser |
| 7,511,959 B2 | | 3/2009 | Belady et al. |
| 7,511,960 B2 | | 3/2009 | Hillis et al. |
| 7,551,971 B2 | | 6/2009 | Hillis |
| 7,604,027 B2 | | 10/2009 | Thatcher |
| 7,609,518 B2 | | 10/2009 | Hopton et al. |
| 7,686,175 B2 | | 3/2010 | Waisanen |
| 7,724,513 B2 | | 5/2010 | Coglitore et al. |
| 7,724,517 B2 | | 5/2010 | Attlesey et al. |
| 7,757,506 B2 | | 7/2010 | Ellsworth, Jr. et al. |
| 7,843,298 B2 | | 11/2010 | Hosokawa et al. |
| 7,854,652 B2 | | 12/2010 | Yates et al. |
| 7,856,838 B2 | | 12/2010 | Hillis et al. |
| 7,905,106 B2 | | 3/2011 | Attlesey |
| 7,911,782 B2 | | 3/2011 | Attlesey et al. |
| 7,911,793 B2 | | 3/2011 | Attlesey |
| 7,934,386 B2 | | 5/2011 | Rummel et al. |
| 7,961,463 B2 | | 6/2011 | Belady et al. |
| 7,971,632 B2 | | 7/2011 | Eriksen |
| 7,983,040 B2 | | 7/2011 | Campbell et al. |
| 8,009,419 B2 | | 8/2011 | Attlesey et al. |
| 8,047,904 B2 | | 11/2011 | Yates et al. |
| 8,213,261 B2 | | 7/2012 | Imhof et al. |
| 8,295,047 B1 | | 10/2012 | Hamburgen et al. |
| 8,310,829 B2 | | 11/2012 | Monk et al. |
| 8,654,529 B2 | | 2/2014 | Attlesey |
| 8,817,465 B2 | | 8/2014 | Campbell et al. |
| 8,964,391 B2 | | 2/2015 | Campbell et al. |
| 9,042,098 B2 | | 5/2015 | Campbell et al. |
| 9,049,800 B2 | | 6/2015 | Shelnutt et al. |
| D744,996 S | | 12/2015 | Keisling et al. |
| 9,269,544 B2 | | 2/2016 | Koo et al. |
| 9,386,727 B2 | * | 7/2016 | Barringer ........... H05K 7/20736 |
| 9,439,327 B1 | | 9/2016 | Sheng et al. |
| 9,504,190 B2 | | 11/2016 | Best |
| 9,664,180 B2 | * | 5/2017 | Saavedra ................ F03G 6/02 |
| 9,699,938 B2 | | 7/2017 | Shelnutt et al. |
| D796,654 S | | 9/2017 | Baker et al. |
| 9,756,766 B2 | | 9/2017 | Best |
| 9,801,465 B1 | | 10/2017 | Finch, Jr. |
| 9,861,194 B1 | | 1/2018 | Park |
| D821,326 S | | 6/2018 | Kreiner |
| 9,992,914 B2 | | 6/2018 | Best et al. |
| 10,123,463 B2 | | 11/2018 | Best et al. |
| 10,212,849 B2 | | 2/2019 | Matsumoto et al. |
| 10,306,804 B2 | | 5/2019 | Chester et al. |
| D852,936 S | | 7/2019 | Baker et al. |
| 10,342,164 B2 | * | 7/2019 | So ..................... H05K 7/20772 |
| 10,405,457 B2 | | 9/2019 | Boyd et al. |
| D875,206 S | | 2/2020 | Gourgel et al. |
| 10,667,427 B2 | | 5/2020 | Gao |
| 10,743,438 B2 | | 8/2020 | Wakino et al. |
| 10,820,446 B2 | | 10/2020 | Boyd et al. |
| 10,939,581 B1 | | 3/2021 | Chen et al. |
| 11,000,943 B2 | | 5/2021 | Reynolds |
| 11,359,865 B2 | | 6/2022 | Stone et al. |
| 11,369,041 B2 | | 6/2022 | Yang et al. |
| 11,457,735 B1 | | 10/2022 | D'Lsep |
| 11,516,943 B2 | * | 11/2022 | Bilan ................. H05K 7/20236 |
| 2002/0014460 A1 | | 2/2002 | McKay |
| 2002/0080575 A1 | | 6/2002 | Nam et al. |
| 2002/0151799 A1 | | 10/2002 | Pantages et al. |
| 2002/0185262 A1 | | 12/2002 | Baer |
| 2002/0189173 A1 | | 12/2002 | Staschik |
| 2003/0053293 A1 | | 3/2003 | Beitelmal et al. |
| 2003/0127240 A1 | | 7/2003 | Beckbissinger et al. |
| 2004/0008490 A1 | | 1/2004 | Cheon |
| 2004/0013563 A1 | | 1/2004 | Romer et al. |
| 2004/0050491 A1 | | 3/2004 | Miya et al. |
| 2004/0223300 A1 | | 11/2004 | Fink et al. |
| 2004/0246683 A1 | | 12/2004 | Honsberg-Riedl et al. |
| 2004/0254682 A1 | | 12/2004 | Kast |
| 2005/0011839 A1 | | 1/2005 | Dart et al. |
| 2005/0024826 A1 | | 2/2005 | Bash et al. |
| 2005/0052847 A1 | | 3/2005 | Hamman |
| 2005/0083657 A1 | | 4/2005 | Hamman |
| 2005/0111184 A1 | | 5/2005 | Cliff et al. |
| 2005/0114876 A1 | | 5/2005 | Atarashi et al. |
| 2005/0152112 A1 | | 7/2005 | Holmes et al. |
| 2005/0259402 A1 | | 11/2005 | Yasui et al. |
| 2006/0026610 A1 | | 2/2006 | Sasao et al. |
| 2006/0064709 A1 | | 3/2006 | Throckmorton et al. |
| 2006/0123436 A1 | | 6/2006 | Tanaka et al. |
| 2006/0135042 A1 | | 6/2006 | Frost et al. |
| 2006/0250755 A1 | | 11/2006 | Tilton et al. |
| 2006/0274501 A1 | | 12/2006 | Miller |
| 2007/0006599 A1 | | 1/2007 | Kawamura et al. |
| 2007/0025081 A1 | | 2/2007 | Berlin et al. |
| 2007/0029011 A1 | | 2/2007 | Thatcher |
| 2007/0034360 A1 | | 2/2007 | Hall |

(56) References Cited

U.S. PATENT DOCUMENTS

| | | |
|---|---|---|
| 2007/0199340 A1 | 8/2007 | Knight et al. |
| 2007/0213000 A1 | 9/2007 | Day |
| 2007/0227710 A1 | 10/2007 | Belady et al. |
| 2007/0267741 A1 | 11/2007 | Attlesey et al. |
| 2008/0002364 A1 | 1/2008 | Campbell et al. |
| 2008/0017355 A1 | 1/2008 | Attlesey et al. |
| 2008/0026509 A1 | 1/2008 | Campbell et al. |
| 2008/0029250 A1 | 2/2008 | Carlson et al. |
| 2008/0030945 A1 | 2/2008 | Mojaver et al. |
| 2008/0055845 A1 | 3/2008 | Murakami et al. |
| 2008/0158818 A1 | 7/2008 | Clidaras et al. |
| 2008/0174954 A1 | 7/2008 | Vangilder et al. |
| 2008/0180908 A1 | 7/2008 | Wexler |
| 2008/0196868 A1 | 8/2008 | Attlesey et al. |
| 2008/0196870 A1 | 8/2008 | Attlesey et al. |
| 2008/0209931 A1 | 9/2008 | Stevens |
| 2008/0266726 A1* | 10/2008 | Murakami ........... H05K 7/2079 361/1 |
| 2008/0270572 A1 | 10/2008 | Belady et al. |
| 2008/0273306 A1 | 11/2008 | Cambell et al. |
| 2009/0168345 A1 | 7/2009 | Martini |
| 2009/0219681 A1 | 9/2009 | Goth et al. |
| 2009/0229194 A1 | 9/2009 | Armillas |
| 2009/0251860 A1 | 10/2009 | Belady et al. |
| 2009/0260777 A1 | 10/2009 | Attlesey |
| 2009/0262455 A1 | 10/2009 | Merrow |
| 2009/0295167 A1 | 12/2009 | Clidaras et al. |
| 2010/0027212 A1 | 2/2010 | Armilas |
| 2010/0030267 A1 | 2/2010 | Winslow et al. |
| 2010/0033070 A1 | 2/2010 | Cheng |
| 2010/0061057 A1 | 3/2010 | Dersch et al. |
| 2010/0103618 A1 | 4/2010 | Campbell et al. |
| 2010/0139887 A1 | 6/2010 | Slessman |
| 2010/0165565 A1 | 7/2010 | Hellriegal et al. |
| 2010/0226094 A1 | 9/2010 | Attlesey et al. |
| 2010/0246118 A1 | 9/2010 | Attlesey |
| 2010/0263885 A1 | 10/2010 | Tuma |
| 2010/0275441 A1 | 11/2010 | Rasmussen et al. |
| 2010/0290190 A1 | 11/2010 | Chester et al. |
| 2010/0302678 A1 | 12/2010 | Merrow |
| 2010/0328889 A1 | 12/2010 | Campbell et al. |
| 2011/0075353 A1 | 3/2011 | Attlesey et al. |
| 2011/0103019 A1 | 5/2011 | Levi et al. |
| 2011/0120885 A1 | 5/2011 | Miller et al. |
| 2011/0132579 A1 | 6/2011 | Best et al. |
| 2011/0134604 A1 | 6/2011 | Attlesey |
| 2011/0151765 A1 | 6/2011 | Chen et al. |
| 2011/0157829 A1 | 6/2011 | Wormsbecher et al. |
| 2011/0183051 A1 | 7/2011 | Skender |
| 2011/0240281 A1 | 10/2011 | Avery |
| 2011/0267775 A1 | 11/2011 | Vanderveen et al. |
| 2012/0026691 A1 | 2/2012 | Campbell et al. |
| 2012/0035773 A1 | 2/2012 | Stabinski et al. |
| 2012/0123595 A1 | 5/2012 | Bower, III et al. |
| 2012/0155027 A1 | 6/2012 | Broome et al. |
| 2012/0171943 A1 | 7/2012 | Dunnavant |
| 2012/0236487 A1 | 9/2012 | Wallace et al. |
| 2012/0294737 A1 | 11/2012 | Singh et al. |
| 2012/0300391 A1 | 11/2012 | Keisling et al. |
| 2013/0021746 A1 | 1/2013 | Campbell et al. |
| 2013/0025888 A1 | 1/2013 | Eckholm et al. |
| 2013/0032217 A1 | 2/2013 | Pesek et al. |
| 2013/0075066 A1 | 3/2013 | Reyblat |
| 2013/0091814 A1 | 4/2013 | Smith |
| 2013/0105120 A1 | 5/2013 | Campbell et al. |
| 2013/0105139 A1 | 5/2013 | Campbell et al. |
| 2013/0146273 A1 | 6/2013 | Chester et al. |
| 2014/0060773 A1* | 3/2014 | Wajima ............. H05K 7/20836 165/11.1 |
| 2014/0060799 A1* | 3/2014 | Eckberg ............. G05D 23/1932 165/287 |
| 2014/0085817 A1 | 3/2014 | Campbell et al. |
| 2014/0085821 A1 | 3/2014 | Regimbal et al. |
| 2014/0109610 A1 | 4/2014 | Wulf et al. |
| 2014/0124167 A1 | 5/2014 | Campbell et al. |
| 2014/0211412 A1 | 7/2014 | Best |
| 2014/0216686 A1 | 8/2014 | Shelnutt et al. |
| 2014/0216688 A1 | 8/2014 | Shelnutt et al. |
| 2014/0218858 A1 | 8/2014 | Shelnutt et al. |
| 2014/0301037 A1 | 10/2014 | Best |
| 2014/0307384 A1 | 10/2014 | Best |
| 2014/0362527 A1 | 12/2014 | Best |
| 2015/0048950 A1 | 2/2015 | Zeighami et al. |
| 2015/0062806 A1 | 3/2015 | Shelnutt et al. |
| 2015/0138723 A1* | 5/2015 | Shedd ................. F25B 41/00 165/104.29 |
| 2015/0181762 A1 | 6/2015 | Boyd et al. |
| 2015/0195953 A1 | 7/2015 | Best et al. |
| 2015/0245539 A1 | 8/2015 | Pelletier et al. |
| 2015/0276292 A1 | 10/2015 | Son et al. |
| 2015/0305209 A1 | 10/2015 | Inaba et al. |
| 2015/0334880 A1 | 11/2015 | Best |
| 2015/0359145 A1 | 12/2015 | Zhang et al. |
| 2016/0234970 A1 | 8/2016 | Shelnutt et al. |
| 2017/0142868 A1 | 5/2017 | Chen et al. |
| 2017/0265328 A1 | 9/2017 | Sasaki et al. |
| 2017/0265358 P1 | 9/2017 | Trees |
| 2017/0303434 A1 | 10/2017 | Katsumata et al. |
| 2017/0303443 A1 | 10/2017 | Inano et al. |
| 2017/0332514 A1 | 11/2017 | Saito |
| 2017/0359918 A1 | 12/2017 | Klaba et al. |
| 2018/0020571 A1 | 1/2018 | Saito |
| 2018/0020572 A1 | 1/2018 | Fujiwara et al. |
| 2018/0288906 A1 | 10/2018 | Hopton et al. |
| 2018/0368281 A1 | 12/2018 | Wang et al. |
| 2019/0090383 A1 | 3/2019 | Tufty et al. |
| 2019/0200482 A1 | 6/2019 | Boyd et al. |
| 2019/0329973 A1 | 10/2019 | Chabot |
| 2019/0344424 A1 | 11/2019 | Reynolds |
| 2019/0387641 A1 | 12/2019 | Aoki et al. |
| 2020/0093038 A1 | 3/2020 | Enright et al. |
| 2020/0323108 A1 | 10/2020 | Bilan et al. |
| 2021/0105910 A1* | 4/2021 | McCarthy .......... H05K 7/20745 |
| 2021/0368656 A1* | 11/2021 | Heydari ............ H05K 7/20836 |
| 2021/0382533 A1* | 12/2021 | Heydari ................. G06F 1/206 |
| 2021/0400834 A1 | 12/2021 | Shen et al. |
| 2022/0220976 A1* | 7/2022 | Perevozchikov ...... H02K 9/193 |
| 2022/0248564 A1 | 8/2022 | Moon |
| 2023/0052701 A1 | 2/2023 | Chen et al. |
| 2023/0091814 A1 | 3/2023 | Gordon et al. |
| 2023/0164953 A1 | 5/2023 | Gregory et al. |
| 2023/0269900 A1 | 8/2023 | Kelly et al. |

FOREIGN PATENT DOCUMENTS

| | | |
|---|---|---|
| CN | 109769381 A | 5/2019 |
| CN | 109874275 A | 6/2019 |
| CN | 111240448 A | 6/2020 |
| CN | 113795118 A | 12/2021 |
| CN | 114138084 A | 3/2022 |
| CN | 115407848 A | 11/2022 |
| GB | 8201450000-2000 | 5/2022 |
| JP | 2004319628 | 11/2004 |
| JP | 2004363308 | 12/2004 |
| JP | 2005015171 A | 1/2005 |
| JP | 2011-518395 A | 6/2011 |
| JP | 2018019038 A | 2/2018 |
| JP | 2019161201 A | 9/2019 |
| JP | 2021-519978 A | 8/2021 |
| KR | 20150018884 A | 2/2015 |
| WO | 2007023130 A1 | 3/2007 |
| WO | 2007098078 A2 | 8/2007 |
| WO | 2008027931 A2 | 3/2008 |
| WO | 2008089322 A2 | 7/2008 |
| WO | 2010019517 A1 | 2/2010 |
| WO | 2013022805 A1 | 2/2013 |
| WO | 2019061721 A1 | 4/2019 |
| WO | 2020-234600 A1 | 11/2020 |

OTHER PUBLICATIONS

International Search Report and Written Opinion of the International Searching Authority received from the Korean Intellectual

(56) References Cited

OTHER PUBLICATIONS

Property Office in related International Application No. PCT/US2022/043817 dated Jan. 10, 2023.
"Disruptive Technologies," SC10 Disruptive Technologies, Retrieved from http://sc10.supercomputing.org/index-pg=disrupttech.html, Nov. 13-19, 2010, 8 pages.
Extended European Search Report for European Application No. 09807136.8, mailed Jun. 6, 2017, 12 Pages.
Intel, "Intel® Pentium® 4 Processor on 90 nm Process," Datasheet, Feb. 2005, pp. 64-65.
International Preliminary Report on Patentability, Application No. PCT/US2014/037005, mailed Nov. 19, 2015, 12 pages.
International Preliminary Report on Patentability for International Application No. PCT/US2009/053305, mailed Feb. 24, 2011, 19 pages.
International Preliminary Report on Patentability for International Application No. PCT/US2015/030618, mailed Nov. 24, 2016, 10 pages.
International Search Report and Written Opinion for International Application No. PCT/US2014/033081, mailed Aug. 27, 2014, 9 pages.
Office Action for Chinese Application No. 200980131707.3, mailed Jul. 31, 2013, 8 pages.
Park J, "New Cooling Strategies for Greater Data Center Energy Efficiency," Facebook, Nov. 4, 2010, 4 pages.
Supplementary Examination Report for Singapore Application No. 11202000306X, mailed Nov. 18, 2022, 4 pages.
U.S. Appl. No. 13/057,881, filed Feb. 7, 2011, Christiaan Scott Best, 72 pages.
U.S. Appl. No. 14/667,091, filed Mar. 24, 2015, Christiaan Scott Best, 65 pages.
USPTO, International Search Report & Written Opinion, Application No. PCT/US2015/43468, mailed Oct. 30, 2015 (11 pages).
Canadian Intellectual Property Office, Office Action, Canadian Application No. 2,731,994, mailed Dec. 3, 2015 (6 pages).
USPTO, Non-final Office Action, U.S. Appl. No. 14/251,014, mailed Dec. 4, 2015 (13 pages).
USPTO, Non-Final Office Action, U.S. Appl. No. 14/271,386, mailed Dec. 17, 2015, (17 pages).
USPTO, Non-final Office Action, U.S. Appl. No. 14/245,978, mailed Jan. 13, 2016 (33 pages).
Andre Bakker, "Modeling Flow Fields in Stirred Tanks," 2006, (40 pages).
Hernandez, "Will IT Managers Warm to Liquid-Cooled Servers?" Dec. 8, 2009 (3 pages).
European Patent Office, Examination Report, Communication pursuant to Article 94(3) EPC, dated Nov. 26, 2018, for European Patent Application No. 09807136.8 from the European Patent Office, (13 pages).
Intel Core 2 Duo Processor on 65 nm Process for Empedded Applications, Aug. 2007, Intel, pp. 1, 14 and 21 (3 Pages).
Canadian Intellectual Property Office, Office Action dated Nov. 8, 2016, for Canadian Patent Application No. 2,731,994 related to National Phase of Application No. PCT/US2009/053305 filed Aug. 10, 2009 (4 pages).
Miller, Rich, "Data Center Used to Heat Swimming Pool," Apr. 2, 2008, retrieved from the Internet: URL:https://www.datacenterknowledge.com/archives/2008/04/02/data-center-used-to-heat-swimming-pool [retrieved on Nov. 13, 2018] (2 pages).
"Green Revolution Cooling Named Disruptive at SC'09," Press Release, Aug. 3, 2009, Austin, TX (1 page).
USPTO, International Search Report and Written Opinion dated Oct. 14, 2009, Application No. PCT/US2009/053305 (17 pages).
"Disruptive Technologies", Super Computing, Nov. 14-20, 2009, Oregon Convention Center, Portland, Oregon (2 pages).
Hernandez, "Are Liquid-Cooled Servers Coming to a Data Center Near you?", Clean Tech, Dec. 4, 2009 (2 pages).

"Green Revolution Cooling Named a Disruptive Technology of the Year at SC'10," Press Release, Nov. 1, 2010, New Orleans, LA (1 page).
Markoff, "Data Centers' Power Use Less Than was Expected," The New York Times, Jul. 31, 2011, (3 pages).
Danish Patent and Trademark Office Singapore, Written Opinion and Search Report for Application No. 201100595-6, Apr. 16, 2012, Singapore. (20 pages).
Danish Patent and Trademark Office, Singapore Written Opinion and Search Report dated May 2, 2012, Application No. 201100595-6, (21 pages).
USPTO, International Search Report and Written Opinion from PCT/US2012/49668 dated Oct. 19, 2012. (10 pages).
China National Intellectual Property Administration, Office Action from Chinese Application No. 200980131707.3, dated Dec. 20, 2012, including English-language translation, (17 pages).
USPTO, Office Action from U.S. Appl. No. 13/057,881, issued Jun. 4, 2013, (13 pages).
People's Republic of China, Office Action issued in corresponding Chinese Application No. 200980131707.3 dated Jul. 31, 2013, including English-language Translation (3 pages).
IP Australia, Examination Report from Australian Application No. 2009282170, dated Nov. 15, 2013, (3 pages).
"The Green 500 List—Nov. 2013," The Green 500, Nov. 20, 2013, (3 pages) [http://www.green500.org] (3 pages).
USPTO, Final Office Action from U.S. Appl. No. 13/057,881, issued Nov. 22, 2013 (13 pages).
People's Republic of China, Office Action issued in corresponding Chinese Application No. 200980131707.3 dated Dec. 20, 2013, incl. English Translation (8 pages).
USPTO, Applicant-Initiated Interview Summary from U.S. Appl. No. 13/057,881, issued Feb. 25, 2014 (4 pages).
People's Republic of China, Office Action issued in corresponding Chinese Application No. 200980131707.3 dated Apr. 3, 2014, English Translation (pp. 13).
USPTO, Office Action from U.S. Appl. No. 13/057,881, issued Apr. 11, 2014 (16 pages).
People's Republic of China, Office Action issued in corresponding Application No. 200980131707.3 dated Apr. 18, 2014, incl. English Translation (7 pages).
USPTO, International Search Report & Written Opinion, Application No. PCT/US2014/17835, mailed Jun. 13, 2014 (9 pages).
IP Australia, Patent Examination Report No. 2 from Australian Application No. 200928170 dated Jun. 18, 2014 (4 pages).
USPTO, Applicant-Initiated Interview Summary from U.S. Appl. No. 13/057,881, issued Jul. 1, 2014 (3 pages).
U.S. Appl. No. 14/338,013, filed Jul. 22, 2014, Christian Scott Best (60 pages).
U.S. Appl. No. 14/338,020, filed Jul. 22, 2014, Christian Scott Best (60 pages).
U.S. Appl. No. 14/338,026, filed Jul. 22, 2014, Christian Scott Best (60 pages).
U.S. Appl. No. 14/338,035, filed Jul. 22, 2014, Christian Scott Best (60 pages).
USPTO, International Preliminary Report on Patentability, Application No. PCT/US2014/033081, mailed Aug. 27, 2014 (9 pages).
USPTO, International Search Report & Written Opinion, Application No. PCT/US2014/33834, mailed Sep. 15, 2014 (16 pages).
USPTO, International Search Report & Written Opinion, Application No. PCT/US2014/037005, mailed Sep. 24, 2014 (18 pages).
Lee, Si Young, et al., "Hydraulics and Mixing Evaluations for NT-21/41 Tanks," Oct. 2014 (32 pages).
USPTO, Applicant-Initiated Interview Summary from U.S. Appl. No. 13/057,881, issued Oct. 9, 2014 (3 pages).
USPTO, Final Office Action from U.S. Appl. No. 13/057,881, issued Nov. 3, 2014 (23 pages).
IP Australia, Notice of Acceptance, Australian Application No. 2009282170, mailed Nov. 14, 2014 (2 pages).
The State Intellectual Property of the Preople's Republic of China, Office Action from Chinese Application No. 200980131707.3, dated Dec. 31, 2014, English and Chinese versions, (10 pages).
USPTO, Office Action from U.S. Appl. No. 13/057,881, dated Jan. 9, 2015 (3 pages).

(56) References Cited

OTHER PUBLICATIONS

USPTO, Office Action from U.S. Appl. No. 13/057,881, issued Mar. 3, 2015 (20 pages).
"Intel Xeon Processor E7-4800/8800 v3 Product Families", May 2015, p. 46 (1 page).
Substantive Examination Adverse Report, Malaysian Application No. PI2011000494, mailed May 15, 2015 (3 pages).
USPTO, Non-final Office Action in corresponding U.S. Appl. No. 14/667,091 dated May 22, 2015, (30 pages).
USPTO, Final Office Action in U.S. Appl. No. 13/057,881, mailed Jun. 16, 2015, (30 Pages).
European Patent Office, Supplemental Search Report, European Application No. 12821634.8, mailed Jul. 15, 2015 (6 pages).
USPTO, International Search Report & Written Opinion, Application No. PCT/US2015/30618, mailed Aug. 5, 2015, (12 pages).
International Search Report & Written Opinion, Application No. PCT/US2015/30618, mailed Aug. 27, 2015, (12 pages).
USPTO, Non-Final Office Action, U.S. Appl. No. 14/237,100, mailed Sep. 30, 2015, (21 pages).
China National Intellectual Property Administration, Office Action, Chinese Application No. 201280049039.1, mailed Oct. 27, 2015 (33 pages).
GRC ICE Immersion Cooling Solutions Brochure, published Jun. 2018 [online] [site visited Jul. 25, 2022] internet URL:https://www.grcooling.com/wp-content/uploads/2018/06/GRC_ICE_Product_Brochure.pdf (2018).
GRC ICEraQ® Series 10 Launch Event Presentation, published Dec. 27, 2021 [online] [site visited Jul. 25, 2022] Internet URL:https://digitalinfranetwork.com/videos/655447036-2 (2021).
ICEraQ 10 Quad Duo-SPecification Sheet, published 2021 [online] [site visited Jul. 25, 2022] Internet URL:https://www.grcooling.com/wp-content/uploads/2018/06/GRC_Data_Sheet_ICEraQ_Quad-Duo-One.pdf (2021).
GRC® Releases the Next Generation of Data Center Liquid Immersion Cooling, Providing Increased Sustainability Capable of Delivering a PUE Yield of <1.03 and a Significant Reduction in Operating Costs, published May 18, 2021 [online] [site visited Jul. 25, 2022 (2021) Internet URL: https://www.businesswire.com/news/home/20210518005857/en/GRCE%C2%AE-Releases-the-Next-Generation-of-Delivering-a-PUE-Yield-of-1.03-and-a-Signifcant-Reduction-in-Operating-Costs (2021).
International Search Report and Written Opinion for International Application No. PCT/US2023/026959, mailed Oct. 23, 2023, 8 pages.
Office Action for Chinese Application No. 200980131707.3, mailed Apr. 3, 2013, 3 pages.
Office Action for Chinese Application No. 200980131707.3, mailed Dec. 13, 2013, 4 pages.
International Search Report and Written Opinion for International Application No. PCT/US2023/016342, mailed Jul. 13, 2023, 8 pages.
International Search Report and Written Opinion in PCT/US2023/032438, mailed Dec. 27, 2023, 9 pages.
Non-Final Office Action in U.S. Appl. No. 17/900,541, mailed Jun. 17, 2024, 8 pages.
International Preliminary Report on Patentability in corresponding Application No. PCT/US2022/043817, mailed Mar. 28, 2024 (6 pages).
International Search Report and Written Opinion in corresponding Application No. PCT/US2024/010084, mailed May 1, 2024 (11 pages).
European Patent Office, "Partial Supplementary European Search Report," issued in related European Patent Application No. 21892814.1, mailed Aug. 30, 2024 (15 pages).
U.S. Patent and Trademark Office, "Notice of Allowance and Fee(s) Due," issued in U.S. Appl. No. 17/900,541, mailed Sep. 28, 2024 (8 pages).
International Search Report and Written Opinion in PCT/US2024/035908, mailed Oct. 18, 2024, 9 pages.
International Preliminary Report on Patentability and Written Opinion, Application No. PCT/US2023/016342, mailed Oct. 10, 2024 (5 pages).
USPTO; U.S. Appl. No. 18/244,844; Non-Final Office Action issued Nov. 6, 2024; 65 pages.

* cited by examiner

MULTI-RACK IMMERSION COOLING DISTRIBUTION SYSTEM

RELATED APPLICATIONS

This application claims the benefit of priority to U.S. Provisional Patent Application No. 63/112,745 entitled "Multi-Rack Immersion Cooling Distribution System" filed Nov. 12, 2020 and U.S. Provisional Patent Application No. 63/119,771 entitled "Multi-Rack Immersion Cooling Distribution System" filed Dec. 1, 2020, the entire contents of both of which are hereby incorporated by reference for all purposes.

BACKGROUND

Immersion cooling systems are often used to cool power distribution components of computer systems, such as commercial computer servers, by submerging those components in a tank filled with a dielectric coolant. Often, computer systems include a large array of components. As a result, oversized or custom racks used to hold those components may be hard to find or expensive. In addition, large cooling racks that include a tank to contain the dielectric coolant may not fit through the narrow hallways or doorways of the buildings in which the computer systems are housed. However, using multiple off-the-shelf smaller racks with tanks may require separate cooling systems for each rack. Although a single pump and heat exchanger may be used to cool multiple racks, a problem arises when those racks need to be cooled at different rates. If minor differences in flow are used to vary the cooling rates of the racks, a difference in coolant levels in the various racks may be introduced, which may be a risk to the other racks if the coolant levels that are cooling the other racks gets too low or too high. In instances in which the coolant level is too high, there may be a risk that the coolant level may overflow the tank containing the rack. In instances in which the coolant level is too low, there may be the risk of exposing parts or all of the computer system to air, which can cause overheating due to insufficient cooling. In addition, in instances in which coolant levels fall to too low a level, there may be the risk of introducing air into the coolant fluid circuit, which can damage pumps that circulate the coolant. While the coolant may be pumped out of the bottom of the tanks to avoid air intake, a subsequent leak or failure at a valve and/or duct located near the bottom of the tank could result in a complete draining of the tank. This in turn may again run the risk of exposing parts or all of the computer system to air, which can cause overheating due to insufficient cooling.

SUMMARY

Various aspects include devices, systems, and methods for cooling multiple immersion cooling tanks with a single coolant distribution system. The devices and systems may include a coolant distribution unit, a coolant manifold, a supply and return line, and one or more immersion cooling racks. The coolant distribution unit may be configured to adjust a temperature and pump a fluid used as a coolant. The coolant manifold may redistribute the fluid. The supply line may be coupled to the coolant distribution unit and the coolant manifold. The supply line may be configured to convey the coolant fluid from the coolant distribution unit to the coolant manifold. The return line may be coupled to the coolant distribution unit and the coolant manifold. The return line may be configured to convey the coolant fluid from the coolant manifold to the coolant distribution unit. A first pair of immersion cooling racks may be disposed between the coolant distribution unit and the coolant manifold. Each immersion cooling rack of the first pair of immersion cooling racks may be coupled to the coolant manifold through a first inlet duct for receiving the coolant fluid from the coolant manifold and a first outlet duct for returning the coolant fluid to the coolant manifold.

In some aspects, a second pair of immersion cooling racks may be disposed on an opposite side of the coolant manifold relative to the first pair of immersion cooling racks, wherein each immersion cooling rack of the second pair of immersion cooling racks is coupled to the coolant manifold through a second inlet duct for receiving the coolant fluid from the coolant manifold and a second outlet duct for returning the coolant fluid to the coolant manifold.

In some aspects, at least one of the first inlet duct or the first outlet duct in each immersion cooling rack may be an adjustable valve configured to selectively restrict coolant fluid flow between the coolant manifold and the respective immersion cooling rack. Each of the first pair of immersion cooling racks may include a thermal switch that is triggered when a temperature of the coolant fluid drops below a threshold temperature, wherein the triggering of the thermal switch restricts fluid flow through the adjustable valve. At least one of the first inlet duct or the first outlet duct in each immersion cooling rack may be a one-way valve.

In some aspects, a plurality of inlet ports may be located in each of the first pair of immersion cooling racks, wherein the plurality of inlet ports are adjustable to control an orientation of a flow of coolant fluid through each respective immersion cooling rack. Each of the plurality of inlet ports may comprise an adjustable nozzle or jet to control the orientation of the flow of coolant fluid through each respective immersion cooling rack. Each of the plurality of inlet ports may comprise an adjustable coolant fluid valve to control the flow pressure of coolant fluid passing through the respective inlet port, wherein flow pressure controlled by the adjustable coolant fluid valve may constructively or destructively interfere with coolant fluid flow through adjacent inlet ports to control the orientation of the flow of coolant fluid through each respective immersion cooling rack.

Various aspects may include a system for controlling temperature measured in multiple immersion cooling racks with a single coolant distribution system. The system may include a component coolant tank, a buffer coolant tank, and a weir. The component coolant tank may be configured to hold at least one electronic component at least partially submerged in a coolant fluid pumped into the component coolant tank. The weir may extend along an upper edge of a barrier separating the component coolant tank from the buffer coolant tank, wherein the weir is configured to allow excess coolant fluid from the component coolant tank to spill out of the component coolant tank, over the weir, and into the buffer coolant tank.

In some aspects, the coolant fluid may be pumped into the component coolant tank from inlet ports along a bottom of a sidewall of the component coolant tank. Some aspects may include a whirlpool shield mounted inside the buffer coolant tank above an outlet port for the coolant fluid to exit the buffer coolant tank, wherein a first end of the whirlpool shield is attached to a side wall of the buffer coolant tank and the whirlpool shield extends away from the first end toward a second end disposed further from the outlet port than the first end. The whirlpool shield may extend downward at an angle such that the second end of the whirlpool shield is vertically lower than the first end of the whirlpool shield.

BRIEF DESCRIPTION OF THE DRAWINGS

The accompanying drawings, which are incorporated herein and constitute part of this specification, illustrate exemplary embodiments of the claims and together with the general description given above and the detailed description given below, serve to explain the features of the claims.

DETAILED DESCRIPTION

Figure 1A:
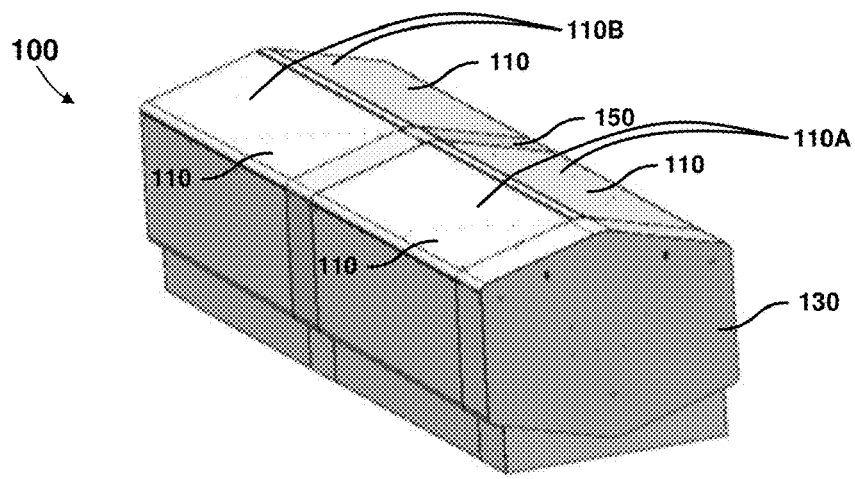
FIGS. 1A-1D are illustrative examples of various aspects of a multi-rack cooling system in accordance with various embodiments.

Various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the claims.

Various embodiments include devices, systems, and methods for controlling the temperature of multiple immersion cooling racks with a single coolant distribution system. Exemplary implementations may include devices, systems, and methods for cooling multiple immersion cooling tanks with a single coolant distribution system. The devices and systems may include a coolant distribution unit, a coolant manifold, a supply and return line, and one or more immersion cooling racks. The coolant distribution unit may be configured to adjust a temperature and pump a fluid used as a coolant. The coolant manifold may redistribute the fluid. The supply line may be coupled to the coolant distribution unit and the coolant manifold. The supply line may be configured to convey the coolant fluid from the coolant distribution unit to the coolant manifold. The return line may be coupled to the coolant distribution unit and the coolant manifold. The return line may be configured to convey the coolant fluid from the coolant manifold to the coolant distribution unit. A first pair of immersion cooling racks may be disposed between the coolant distribution unit and the coolant manifold. Each immersion cooling rack of the first pair of immersion cooling racks may be coupled to the coolant manifold through a first inlet duct for receiving the coolant fluid from the coolant manifold and a first outlet duct for returning the coolant fluid to the coolant manifold.

Some embodiments may include a system for controlling temperature measured in multiple immersion cooling racks with a single coolant distribution system. The system may include a component coolant tank, a buffer coolant tank, and a weir. The component coolant tank may be configured to hold at least one electronic component at least partially submerged in a coolant fluid pumped into the component coolant tank. The weir may extend along an upper edge of a barrier separating the component coolant tank from the buffer coolant tank, wherein the weir is configured to allow excess coolant fluid from the component coolant tank to spill out of the component coolant tank, over the weir, and into the buffer coolant tank.

Immersion cooling racks, in accordance with various embodiments provide a bath of fluid in a tank. The fluid may be circulated such that heat can be rejected from the fluid to the atmosphere (typically via an external cooling device such an evaporative cooling tower) and cool fluid may then be delivered to the heat-generating electronic components that would otherwise overheat. Various embodiment may take advantage of natural methods of circulating/delivering fluids due to density changes as fluid is heated (hot coolant is less dense, which tends to rise to the top of the tank). Another method of circulating/delivering fluid may use a pump, such as from a manifold into the bottom of one or more fluid tanks.

Various embodiments disclosed herein provide for multiple racks coupled together to increase the number and volume of computer system components that may be cooled. By dividing the total number and volume of computer system components to be cooled into multiple racks, the overall cooling system may consist of smaller individual racks that allow for easier movement and placement in a location. The various embodiments provide for a singular coolant distribution unit (sometimes referred to as a CDU) that cools the coolant fluid that is passed through multiple individual racks. Such embodiments may improve efficiency by allowing for a single coolant distribution system to service a plurality of racks.

Computer system components, such as information technology (IT) equipment, may have a depth/width such that passive recirculation (such as depending on the variations in temperature and densities) does not guarantee that the cooler fluid may be delivered evenly throughout the IT equipment. To optimize cooling across all IT equipment, a solution consisting of a pump and jets may be implemented. The jets may be located at the bottom of the tank and may be oriented such that cool fluid is distributed across the bottom of the tank. The orientation of the jet flow shall be flexible enough to suit the need of the product design. In some embodiments, the orientation of the jet flow may be adjustable to control and manipulate the flow of coolant fluid over particular locations and components in the tank. Such adjustment of jet flow orientation may be through the physical manipulation of nozzles or jets. In other embodiments, the adjustment of jet flow orientation may be through the manipulation of flow rates to cause constructive and destructive wave interference. Angled jets (not horizontal) could be implemented for immersion solutions that have IT equipment with shorter chassis.

FIGS. 1A-1D illustrate various aspects of a multi-rack cooling system in accordance with various embodiments. The various embodiments are described herein with regard to a system for controlling the temperature of multiple immersion cooling racks.

FIG. 1A illustrates a multi-rack cooling system 100 in accordance with various embodiments. The embodiment multi-rack cooling system 100 illustrated in FIGS. 1A-1D includes four immersion cooling rack assemblies 110 set up in rows, a coolant distribution unit 130, and a coolant manifold unit 150. In other embodiment multi-rack cooling system (not shown) additional immersion cooling rack assemblies 110 may be included in conjunction with the coolant distribution unit 130, and a coolant manifold unit 150. For example, other embodiment multi-rack cooling systems may include 2, 4, 6, 8, etc. immersion cooling rack assemblies 110 in conjunction with the coolant distribution unit 130, and a coolant manifold unit 150. The coolant distribution unit 130 may be configured to adjust a temperature (e.g., cool down) and pump a fluid used as a coolant into each of the plurality of immersion cooling rack assemblies 110. The fluid may be a liquid dielectric, which is a thermally conductive fluid configured to prevent or rapidly quench electric discharges. The coolant manifold unit 150 may be configured to redistribute the fluid between the coolant distribution unit 130 and the plurality of immersion cooling rack assemblies 110. Each of the immersion cooling rack assemblies 110 may include a component cooling tank configured to hold at least one electronic component fully, or at least partially, submerged in a fluid pumped into the component coolant tank.

Pairs of the immersion cooling rack assemblies 110 may be arranged side-by-side in the multi-rack cooling system 100. For example, a first pair of immersion cooling rack assemblies 110A may be disposed between the coolant distribution unit 130 and the coolant manifold unit 150. Also, a second pair of immersion cooling rack assemblies 110B disposed on an opposite side of the coolant manifold unit 150 relative to the first pair of immersion cooling rack assemblies 110A.

Various embodiments may use multiple immersion cooling rack assemblies 110 in parallel to reduce the cost per space of cooling. For example: four immersion cooling rack assemblies 110 of approximately 50 U may be connected to a single pump. While some datacenters employ the same information technology load in each area or immersion cooling rack assembly 110, some collocation facilities may have significantly different loads from one immersion cooling rack to another. Customer may only require a single rack of space, which needs far fewer resources than a customer using multiple racks.

Various embodiments may provide equal cooling across the plurality of immersion cooling racks, even without any flow regulation between the plurality of immersion cooling rack assemblies 110. The cooling flow may be scaled to handle the hottest of the plurality of immersion cooling rack assemblies 110, which enables the pumping system to work as hard as if the most power dense rack was the average heat generating rack.

Various embodiments may include flow regulation that adjusts and varies the flow of coolant fluid to each of the plurality of immersion cooling rack assemblies 110. This adjustability may allow for reduced power usage of a pump while maintaining the most dense immersion cooling rack assembly 110 by diverting flow to the dense immersion cooling rack assembly 110 rather than increasing flow to all immersion cooling rack assemblies 110. The maximum capacity of the coolant distribution unit 130 may become the sum of the immersion cooling racks power, rather than four times (4×) the peak power rack, which may enable higher density racks.

For example, if a coolant distribution unit 130 has a capacity of 100 kW, the immersion cooling racks may have the following loads.

25, 25, 25, 25 (i.e., even loading, no capacity or efficiency is wasted); or 25, 25, 15, 15 (i.e., uneven loading, associated with wasted efficiency.

If adjustable valves are included for balancing fluid level, the following loads may be possible:

25, 25, 15, 15 (i.e., flow diverted from 15 kW racks to improve efficiency); or 35, 35, 15, 15 (i.e., divert flow from 15 kW to boost capacity of racks over max/4.

Heat loads may be dynamic, so the methods of various embodiments may divert flow automatically, which may be achieved by controlling inlet and outlet temperatures. A temperature sensor on the exhaust may be used to control the amount of fluid flowing through the rack. The fluid entering each rack may act like fluid cooled by the heat exchanger directly. Heat load may be proportional to the flowrate, which may be measured by the difference between inlet and exhaust temperatures (dT). If an immersion cooling rack has a low difference between temperatures, that rack's flow may be constricted, essentially maintaining a constant dT. The main pump may be controlled by those temperatures or by providing a constant pressure. With a constant pressure method, when valves close, the pump may slow down and maintain flow to the least restricted immersion cooling rack.

Figure 1B:
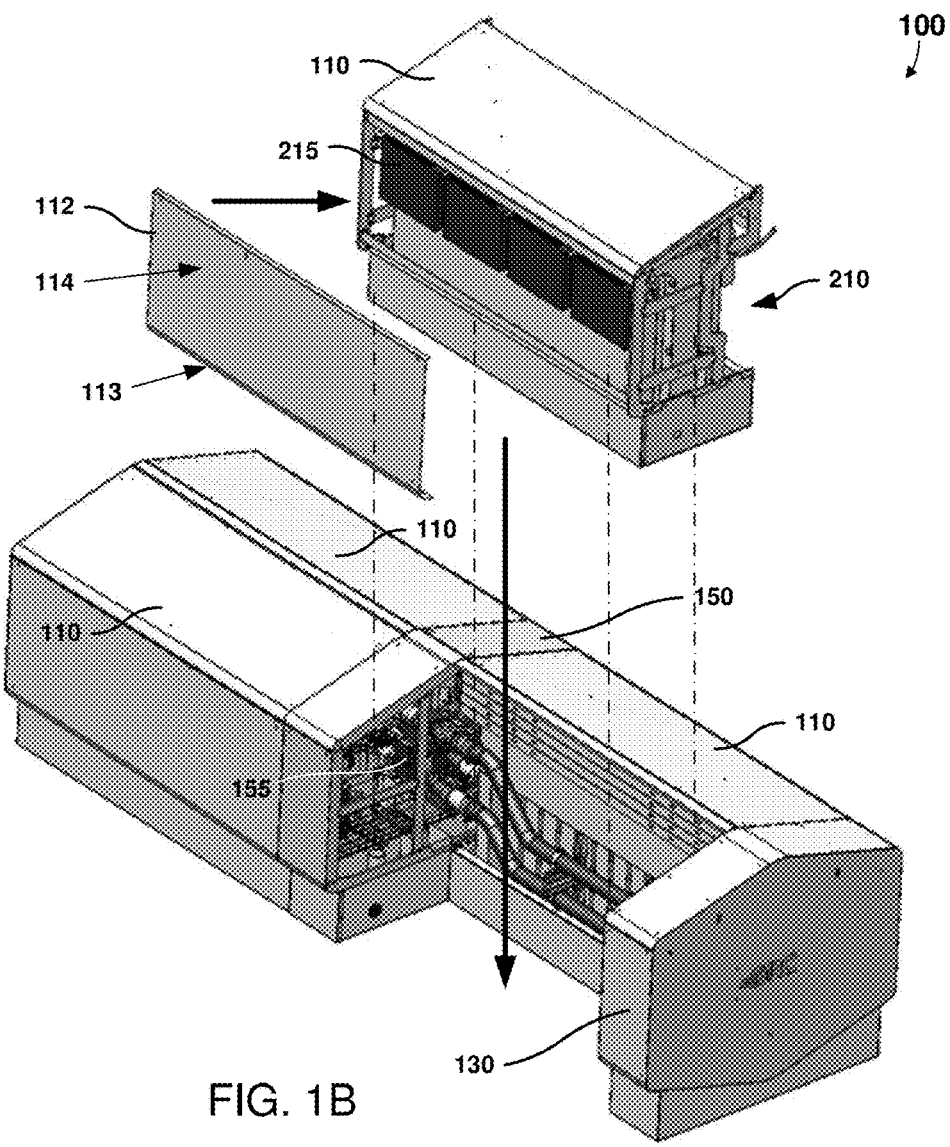

FIG. 1B illustrates a partially exploded view of the multi-rack cooling system 100 in FIG. 1A. In FIG. 1B, one immersion cooling rack assembly 110 has been removed from its station in the multi-rack cooling system 100. An outside panel 112 of the removed immersion cooling rack assembly 110 is pulled away to reveal electronic components 215 attached to an outer side of a frame 210 forming the immersion cooling rack assembly 110. The electronic components 215 may be switches, batteries, transformers, or other components of the immersion cooling rack assembly 110 that may not need to be submerged in coolant. The outside panel 112 at its base 113 may be configured to lie closer to the frame 210 than an upper portion 114, which makes room for the electronic components 215 while forming a toe-kick area at the base 113. The toe-kick area at the base 113 allows technicians to stand more comfortably close to the sides of the multi-rack cooling system 100 while servicing and maintaining the multi-rack cooling system 100.

In addition, in FIG. 1B a lid and side panel of one side of the coolant manifold unit 150 are removed to reveal the coolant manifold 155 located therein. The coolant manifold 155 receives cooled coolant fluid from the coolant distribution unit 130 via plumbing (supply line 132 and return line 134) and redistributes the cooled coolant fluid to each of the individual immersion cooling rack assembly 110. The compartment inside the coolant manifold unit 150 may include sensors for checking temperature, leaks of coolant fluid, and/or the accumulation of water from condensation or other sources.

Figure 1C:
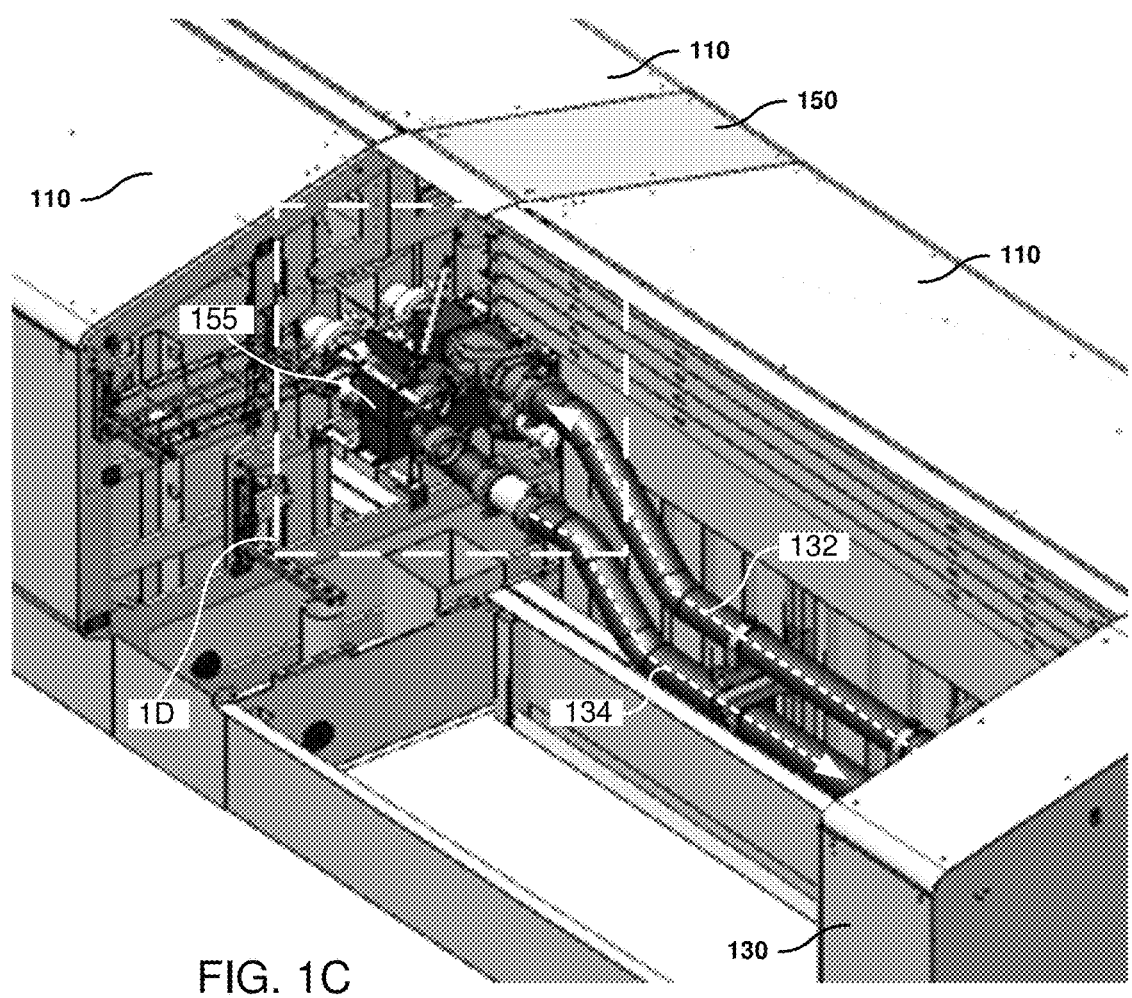

FIG. 1C is a relief view of the partially exploded view of the multi-rack cooling system 100 in FIG. 1B. FIG. 1C illustrates the manner in which a supply line 132 may couple the coolant distribution unit 130 and the coolant manifold 155. In particular, the supply line 132 may be configured to convey the fluid from the coolant distribution unit 130 to the coolant manifold 155. In addition, FIG. 1C illustrates the manner in which a return line 134 may couple the coolant distribution unit 130 and the coolant manifold 155. In particular, the return line 134 may be configured to convey the coolant fluid, that has been heated due to its contact with the various computer components housed in each of the immersion cooling racks, from the coolant manifold 155 to the coolant distribution unit 130. In this way, the supply line 132 may deliver to the coolant manifold 155 cooled coolant fluid from the coolant distribution unit 130 and return heated coolant fluid to the coolant distribution unit 130.

Figure 1D:
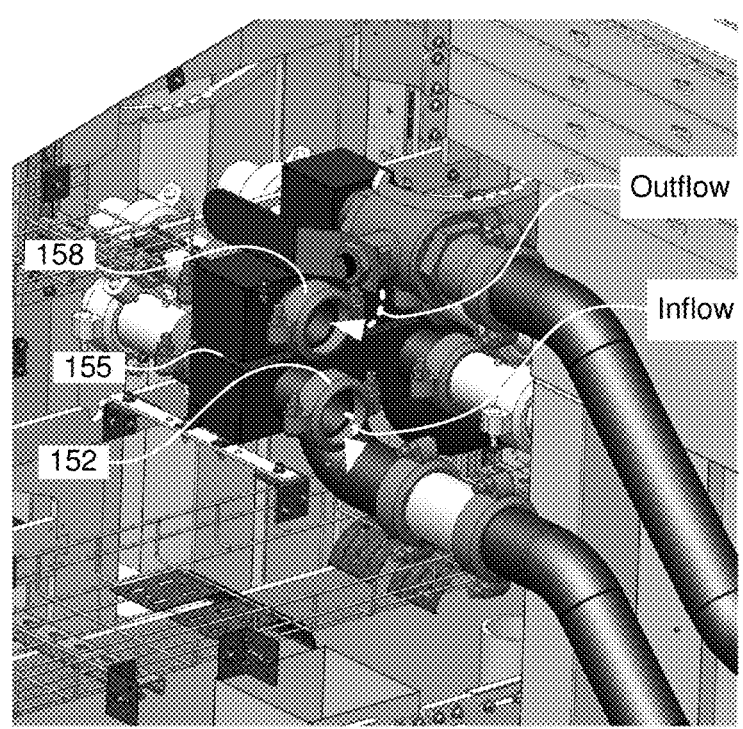

FIG. 1D is a further relief view of the multi-rack cooling system 100 in FIG. 1C. FIG. 1D shows how the coolant manifold 155 may include inlet ducts (i.e., inflow) and outlet ducts (i.e., outflow) configured to be coupled to an immersion cooling rack assembly 110. For example, an immersion cooling rack assembly 110 of the first pair of immersion cooling rack assemblies 110A may be coupled to the coolant manifold 155 through a first inlet duct 152 for receiving the fluid selectively from the coolant manifold 155. Using the first inlet duct 152, the coolant manifold 155 may supply the attached immersion cooling rack assembly 110 an inflow of coolant fluid. Also, the immersion cooling rack assembly 110 of the first pair of immersion cooling rack assemblies 110A may be coupled to the coolant manifold 155 through a first outlet duct 158 for returning the heated coolant fluid to the coolant manifold 155 (and back to coolant distribution unit 130). Using the first outlet duct 158, the coolant manifold 155 may receive an outflow of coolant fluid from the attached immersion cooling rack assembly 110. In embodiments that include four immersion coolant rack assemblies 110 (as shown in FIGS. 1A-1D), the coolant manifold 155 may have four sets of inlet and outlet ducts, each coupled to a different one of the immersion cooling rack assemblies 110. In embodiments in which the number of immersion coolant racks varies, the number of pairs of inlet and outlet ducts will also vary. Thus, a second immersion cooling rack assembly 110 of the first pair of immersion cooling rack assemblies 110B may be coupled to the coolant manifold 155 through a second inlet duct 152 for receiving the fluid selectively from the coolant manifold 155 and so on. Also, the second immersion cooling rack assembly 110 of the second pair of immersion cooling rack assemblies 110B may be coupled to the coolant manifold 155 through a second outlet duct 158 for returning the heated coolant fluid to the coolant manifold 155 (and back to coolant distribution unit 130). In some embodiments, the ducts 152, 158 may include a valve or other flow control element and/or device.

In accordance with various embodiments, a partial solution to the potential coolant level imbalance that may occur when multiple immersion cooling rack assemblies 110 with component cooling tanks are being supported by a single pump and heat exchanger (i.e., coolant distribution unit 130) may be to include a weir between a main coolant tank 220 and buffer coolant tank 230 both included in each immersion cooling rack (110, 210).

Figure 2A:
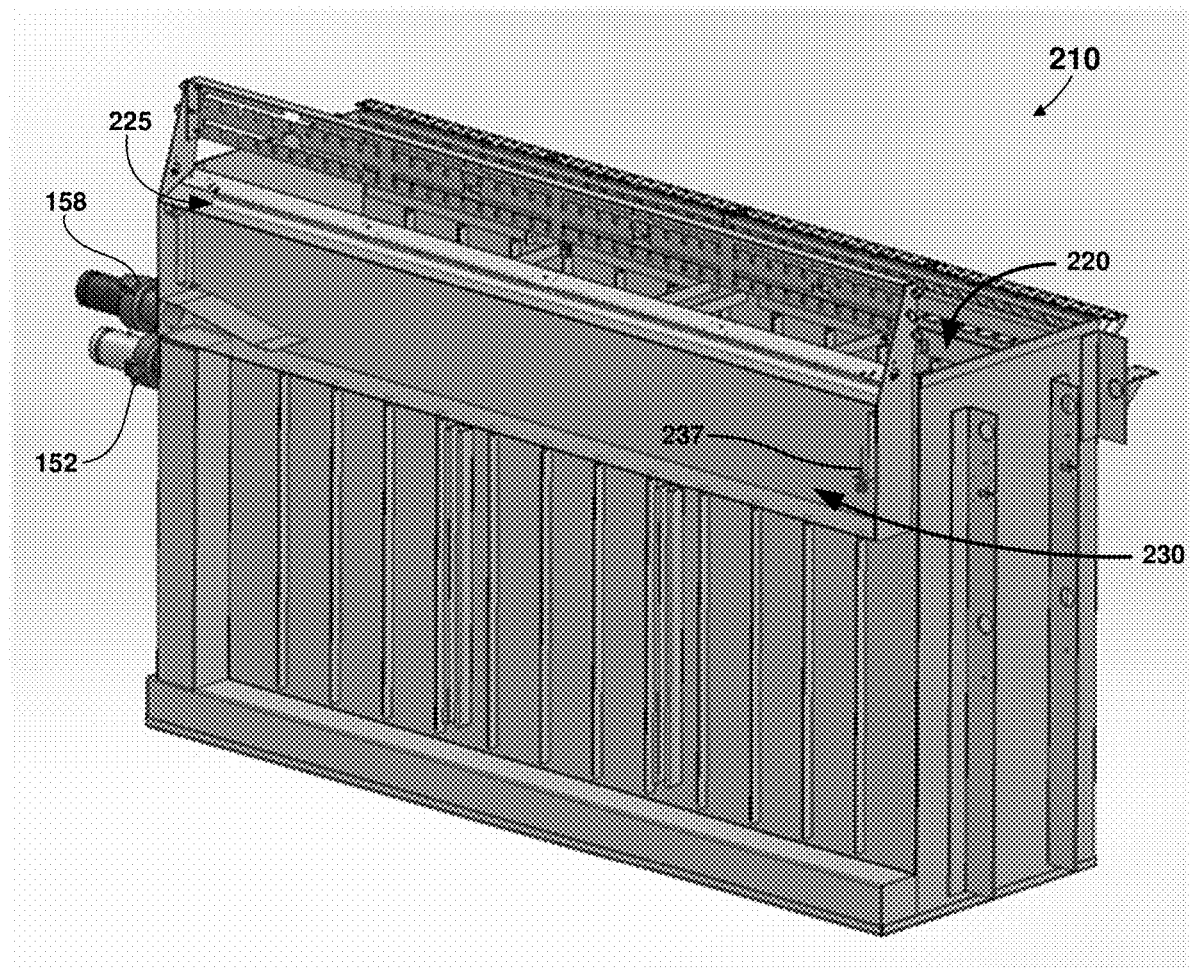
FIG. 2A is a perspective cut-away view of a rear side of an immersion cooling rack, with front and upper walls removed and an outer rear wall shown as transparent to reveal main and buffer coolant tanks, in accordance with various embodiments.
Figure 2B:
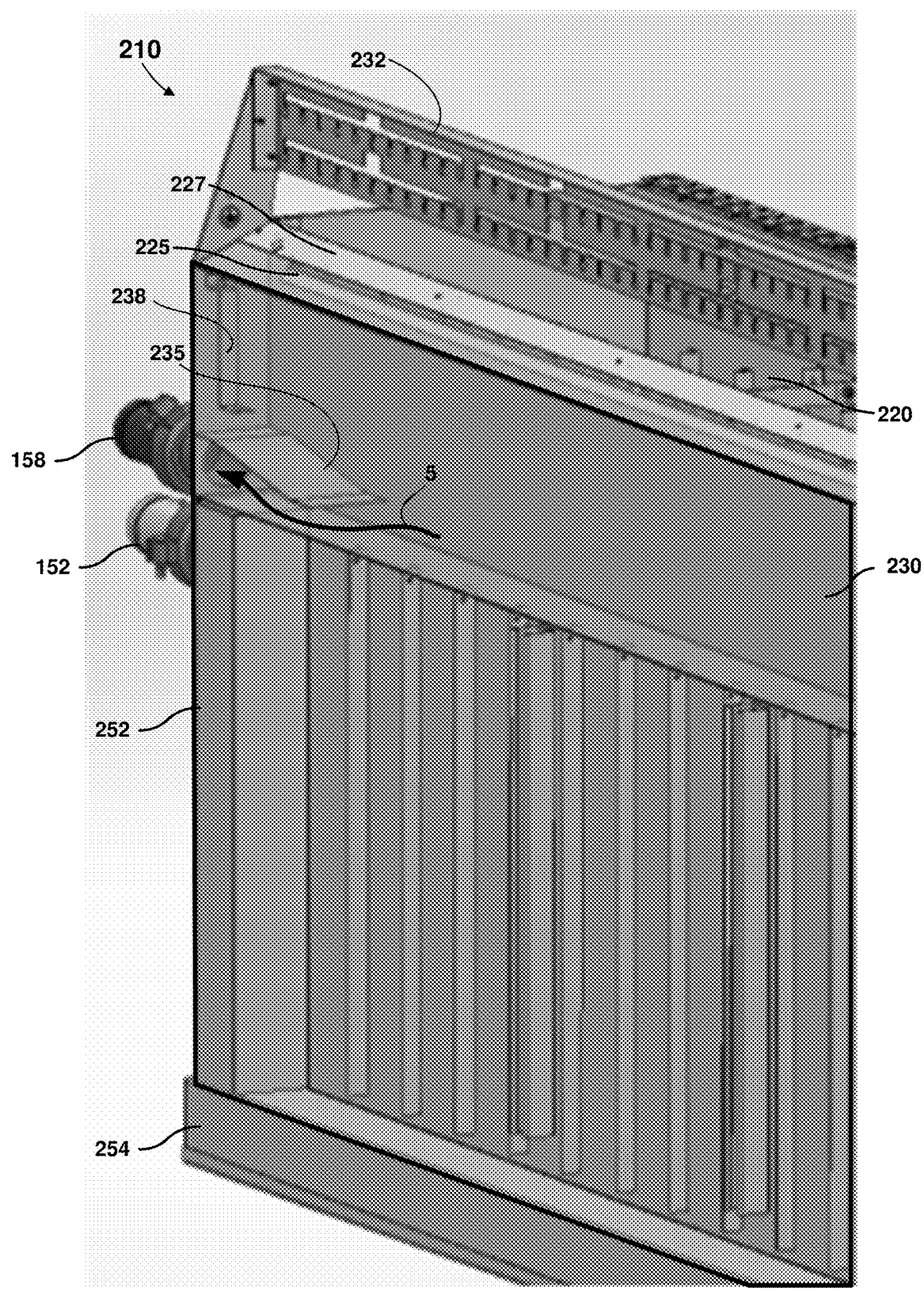
FIG. 2B is a relief view of one side of the immersion cooling rack of FIG. 2A, in accordance with various embodiments.
Figure 2C:
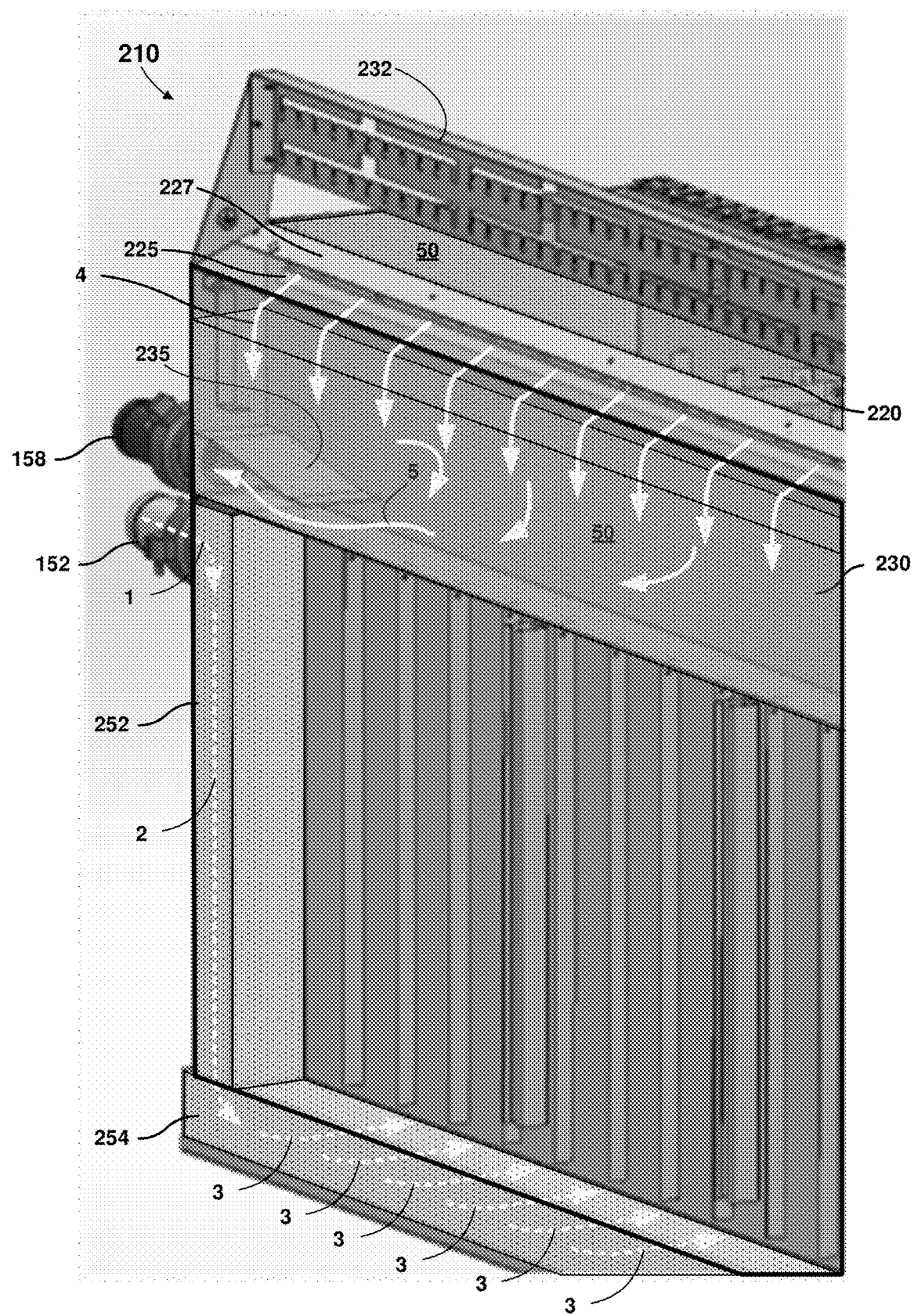
FIG. 2C is a relief view of one side of the immersion cooling rack of FIGS. 2A and 2B with coolant flowing therein, in accordance with various embodiments.
Figure 3A:
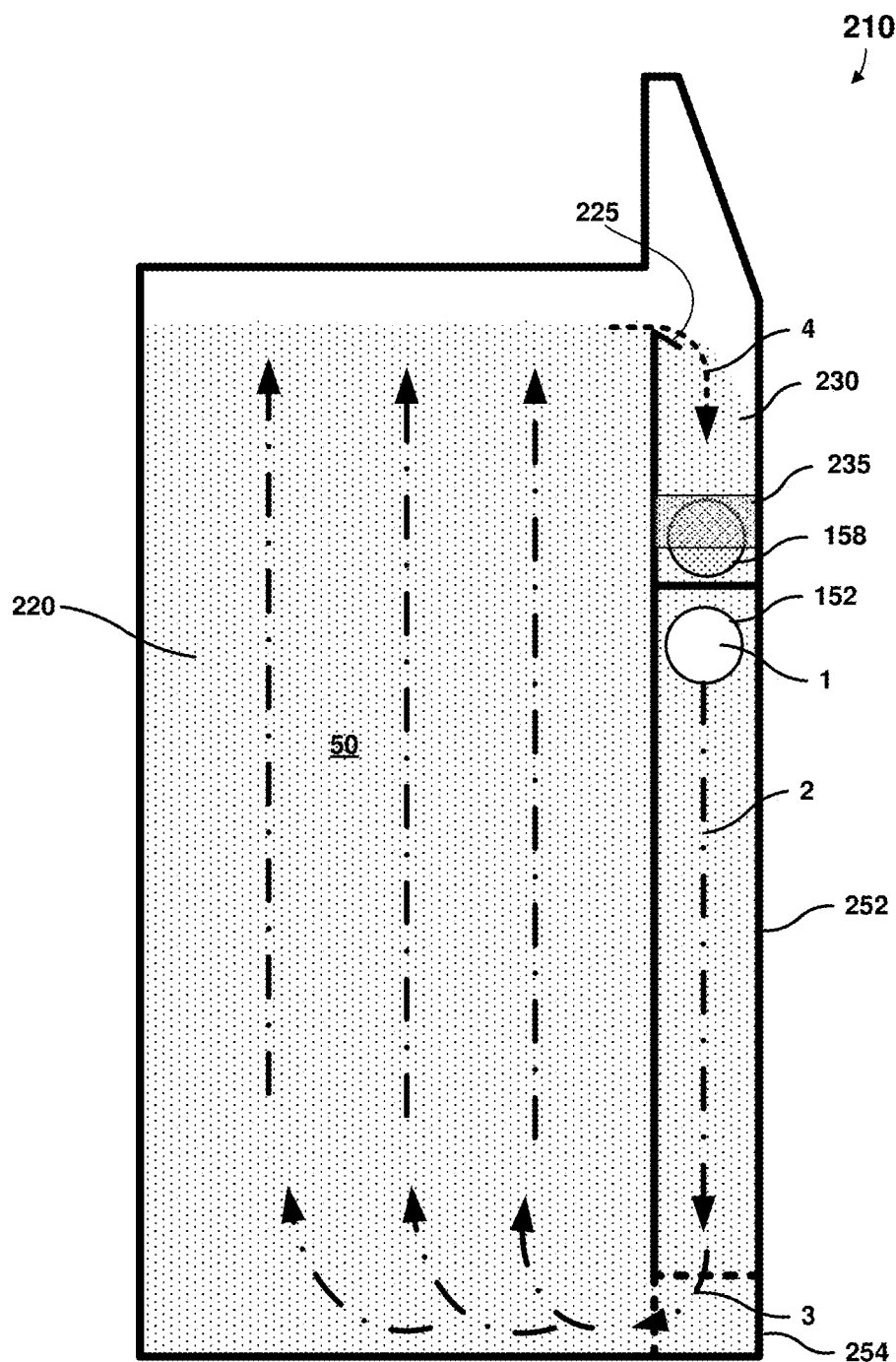
FIG. 3A is a vertical cross-sectional cut-away view of an immersion cooling rack showing various features of various embodiments.

FIGS. 2A-2C illustrate perspective cut-away views of a rear side of an immersion cooling rack 210, with front and upper walls removed and an outer rear wall shown as transparent to reveal component and buffer coolant tanks 230, in accordance with various embodiments. FIG. 2A illustrates the entire immersion cooling rack 210, while FIGS. 2B and 2C are relief views of one side thereof that includes inlet and outlet ports. FIGS. 2A and 2B illustrate the immersion cooling rack 210 with no coolant fluid, while FIG. 2C illustrates a coolant fluid 50 in various parts of the immersion cooling rack 210. FIG. 3A is a side schematic view of the immersion cooling rack 210 showing and exemplary coolant fluid flow, in accordance with various embodiments. The immersion cooling rack 210 includes a component coolant tank 220, a buffer coolant tank 230, and a weir 225. The component coolant tank 220 is configured to contain at least one electronic component (not shown) at least partially submerged in a volume of coolant fluid pumped into the component coolant tank 220. The coolant fluid 50 in the coolant tank 220 should keep the electronic equipment disposed therein from overheating. Thus, in order to ensure the coolant fluid 50 maintains a proper temperature, the coolant tank 220 may include at least one temperature sensor. For example, a thermal switch may be included that is triggered when a temperature of the coolant fluid 50 drops below or rises above a threshold temperature. Triggering of the thermal switch may restrict or increase the fluid flow through an adjustable valve in the coolant manifold 155 or other parts of the coolant fluid flow path. In addition, the coolant tank 220 may include a level sensor to monitor the coolant fluid levels. Still further the coolant tank 220 may include a water sensor that may detect the presence of water that may have spilled or condensed into the coolant fluid 50. The density of the coolant fluid 50 may prevent water from easily mixing into solution with the coolant fluid 50. As water may damage the computer components placed in the rack, the detection of water may be critical to safe and effective operation.

The buffer coolant tank 230 may be a separate tank from the component coolant tank 220. The buffer coolant tank 230 is configured to receive overflow coolant fluid from the component coolant tank 220. The weir 225 may extend along a lower edge of an aperture (see 226 in FIG. 5) near the top of a barrier (i.e., a wall of the component coolant tank 220) separating the component coolant tank 220 from the buffer coolant tank 230. Alternatively, an upper extent of the barrier separating the component coolant tank 220 from the buffer coolant tank 230 may be lower than the other walls of the component coolant tank 220. The weir 225 may be formed as a flat horizontal strip, configured to allow excess coolant fluid 50 to spill out from the component coolant tank 220, over the weir 225, and into the buffer coolant tank 230. In various embodiments, the weir 225 may extend from one side of the component coolant tank 220 to the other. In other embodiments, the weir 225 may only extend across a portion of the component coolant tank 220. In other embodiments, more than one weir 225 may be provided, each extending across different portions of the component coolant tank 220. In this manner, a weir 225 may be disposed on any and all edges of the component coolant tank 220 so that the component coolant tank 220 has a buffer tank around some or all of its perimeter.

Figure 3B:
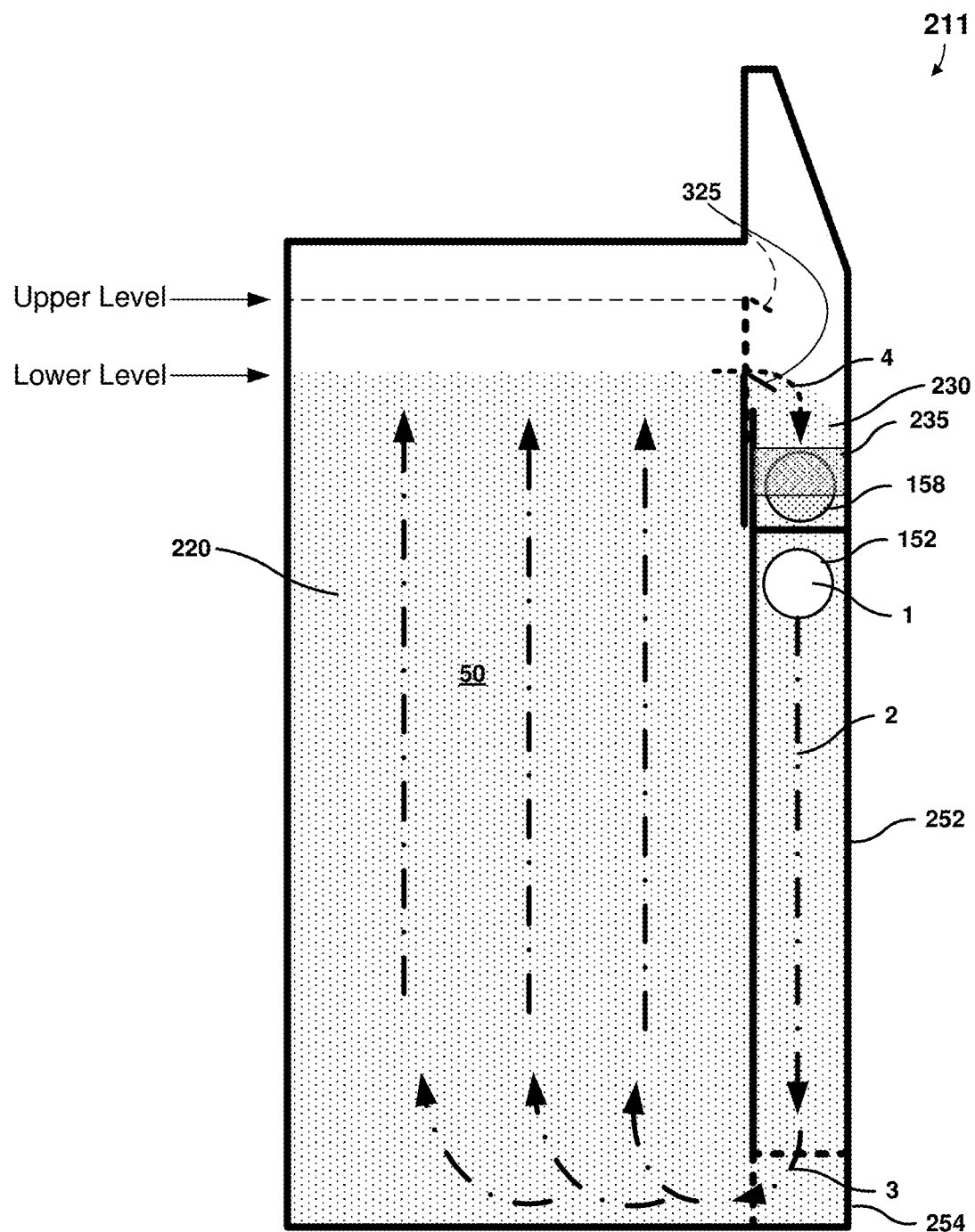
FIG. 3B is a vertical cross-sectional cut-away view of an immersion cooling rack with an adjustable height weir, in accordance with various embodiments.

As shown in FIGS. 2B, 3A and 3B, at a first stage ("1") of fluid flow into the immersion cooling rack 210, coolant fluid 50 may enter from the inlet duct 152 through an inlet port. The inlet duct 152 may be coupled to an inlet port (e.g., an aperture) that is open to the inside of a hollow vertical column 252 configured to direct the coolant fluid 50 through a second stage ("2") of fluid flow toward the bottom of the immersion cooling rack 210. From the hollow vertical column 252, the coolant fluid 50 is directed through a third stage ("3") of coolant fluid flow through a horizontally extending channel 254. An innermost wall of the horizontally extending channel 254 includes a series of apertures (see inlet ports 256 in FIG. 4) that extend from the horizontally extending channel 254 into a lower region of the component coolant tank 220. Once the coolant fluid 50 fills the component coolant tank 220, rather than spilling out of the immersion cooling rack 210, the weir 225 may direct overflow of the coolant fluid 50 to a fourth stage ("4") of coolant fluid flow, which spills over the weir 225 and into the buffer coolant tank 230. In this way, the fourth stage ("4") includes coolant fluid flow through an opening in an upper portion of wall of the component coolant tank 220, which extends from the weir 225 to a weir cover 227 that is vertically spaced away from the weir 225. The weir cover 227 may be removable for service access to the weir 225. The opening in the upper portion of wall of the component coolant tank may be covered with a mesh screen or be formed from a wall portion that includes one or more apertures therein. The vertical height of a highest part of the weir 225 is lower than other upper edges of the component coolant tank 220 that are not intended to retain (i.e., hold back) fluid, to provide a release of overflow coolant fluid 50 in to the buffer coolant tank 230. Once the coolant fluid 50 is in the buffer coolant tank 230, a fifth stage ("5") of coolant fluid 50 flow may exit the immersion cooling rack 210 under a whirlpool shield 235 and out the outlet duct 158. A cable management bar 232 may be provided, extending from one end of the immersion cooling rack 210 to the other, parallel to the weir 225. The cable management bar 232 may be used to attach and/or hold up cables that need to run across the assembly or hold other equipment that needs to be stay out of the coolant fluid 50.

The weir 225 provides a flow mechanism that may maintain a constant level of coolant fluid 50 in the component coolant tank 220, which is upstream of the weir 225. Maintaining a constant level of coolant fluid 50 avoids unintentionally exposing the computer components in the component coolant tank 220 to air, which could occur with variable coolant fluid 50 levels. In addition, the weir 225 may facilitate removal of the hottest coolant fluid 50 from the component coolant tank 220, since the hottest coolant fluid 50 tends to collect toward the top of the volume of coolant fluid 50 due to the relative density of the hotter coolant fluid 50 as compared to the density of the cooler coolant fluid 50. The area immediately downstream of the weir 225, but upstream of the outlet duct 158 may act as a fluid collection zone. The volume of coolant fluid 50 held back by the weir 225 may occasionally run low due to imbalances across the multi-rack cooling system (e.g., 100), but increasing the coolant fluid 50 flow may remedy such low coolant fluid 50 levels. Overflow of coolant fluid 50 over the weir 225 may be recirculated back to the coolant distribution unit 130.

FIG. 3B is a side schematic view of an immersion cooling rack 211 showing and exemplary coolant fluid flow, in accordance with various embodiments. The immersion cooling rack 211 includes the component coolant tank 220, the buffer coolant tank 230, and an adjustable weir 325. When using a weir for level control of the immersion cooling rack 211 or multiple racks, the level of the fluid is set by the height of the adjustable weir 325. As shown, the weir may adjust between an upper level and a lower level. The adjustable weir 325 may be a sliding plate structure that may be raised and lowered. The adjustable weir 325 may have at least two positions (e.g., upper level and lower level), may have one or more incremental positions there between, or may be variably adjustable to any position there between. A servo-mechanism (not shown) may be included that raises or lowers the adjustable weir 325 as needed. Alternatively, the adjustable weir 325 may be formed as a vertical plate that is configured to pivot from a pivot point at the lower level, thereby pivoting the uppermost part thereof down into the component coolant tank 220.

The buffer coolant tank 230 may be formed as large as possible to allow the greatest variance. Constraints on the size of the buffer tank may be linked to an ideal product size, which is generally as small as possible to use the minimum floor space in valuable data center real estate. The immersion cooling racks 210 may be positioned back-to-back with inlets and outlet ducts 152, 158 disposed in the same vertical plane.

Alternatively, the component coolant tank 220 may have more than one buffer tank on different sides thereof. Thus, one or more weirs 225 may be provided between the component coolant tank 220 and each of the sides having a buffer tank. As a further alternative embodiment, the component coolant tank 220 may be surrounded by buffer tanks, allowing overflow in any direction.

Although it may be advantageous to provide the inlet ducts 152 at the lowest portion of the immersion cooling rack 210, design considerations may prevent such inlet ducts 152 position. For example, in instances in which the fittings, gaskets or components of the inlet ducts 152 fails, a low inlet port position could result in the draining of all or most of the coolant fluid 50 in the immersion cooling rack 210. Thus, it may be advantageous to position the inlet ducts 152 as high as possible to reduce lost fluid in the event of a leak. There is a method of determining required fluid containment volume by regulation that the containment volume must catch the probable volume. It is far more likely that a fitting connection would leak than a sealed welded vessel. Thus, raising the inlet height may reduce the probable leak volume and hence the required infrastructure to catch leaks.

It may be advantageous to position the outlet duct 158 as low as possible to maximize variance volume. Variance volume may be defined by the difference in volume of fluid in the collection zone between max and min levels. The max fluid level in the collection zone may be considered almost to the edge of the weir 225, the lowest when air enters the pump suction.

The whirlpool shield 235 may ensure only coolant fluid 50, and not air, is suctioned through the outlet duct 158. The intake or suctioning of air into the outlet duct 158 may damage a pump (not shown) that is used to circulate the coolant fluid 50. The whirlpool shield 235 may be mounted inside the buffer coolant tank 230 above the outlet 158 for the coolant fluid 50 to exit the buffer coolant tank 230. A first end of the whirlpool shield 235 may be attached to a side wall of the buffer coolant tank 230. The whirlpool shield 235 may extend away from the first end toward a second end disposed further from the outlet duct than the first end. Also, the whirlpool shield 235 may extend downward at an angle (i.e., with a slope) such that the second end of the whirlpool shield 235 is vertically lower than the first end of the whirlpool shield 235. Alternatively, the whirlpool shield 235 may be formed to have an L-shape, extending away from the outlet 158, toward the central part of the buffer coolant tank 230, and then bending downward at a remote end thereof. Including the whirlpool shield 235 may lower the minimum fluid level needed to be maintained in the buffer coolant tank 230 before air gets sucked into the outlet duct 158. In addition, the whirlpool shield 235 may prevent air bubbles caused by coolant fluid 50 flowing over the weir 225 into the buffer coolant tank 230 from entering the outlet duct 158. In other words, the whirlpool shield 235 may ensure only fluid is expelled from the bottom of the collection zone. Also, the whirlpool shield 235 may prevent whirlpool flows inside the buffer coolant tank 230, particularly right next to the outlet duct 158. For example, with the whirlpool shield 235 mounted immediately above a 2.5" diameter outlet duct aperture, the minimum fluid height may be lowered by inches, such as ½" from the bottom of the buffer coolant tank 230. The fluid 50 in the buffer coolant tank 230 will be forced under the second end of the whirlpool shield 235.

The buffer coolant tank 230 may also include one or more sensors, such as the fluid level sensor 237 (see FIG. 2A), which may be used to detect when a level of the coolant fluid 50 is getting low. If the level of the coolant fluid 50 gets too low, the outlet duct 158 may start taking in air, which may not be desirable. The fluid level sensor 237 may be a float sensor that rises and falls with the level of coolant 50. Additionally, a temperature sensor may be included, which may be mounted inside the buffer coolant tank as well, such as on a sensor bracket 238 (see FIG. 2B).

Figure 4:
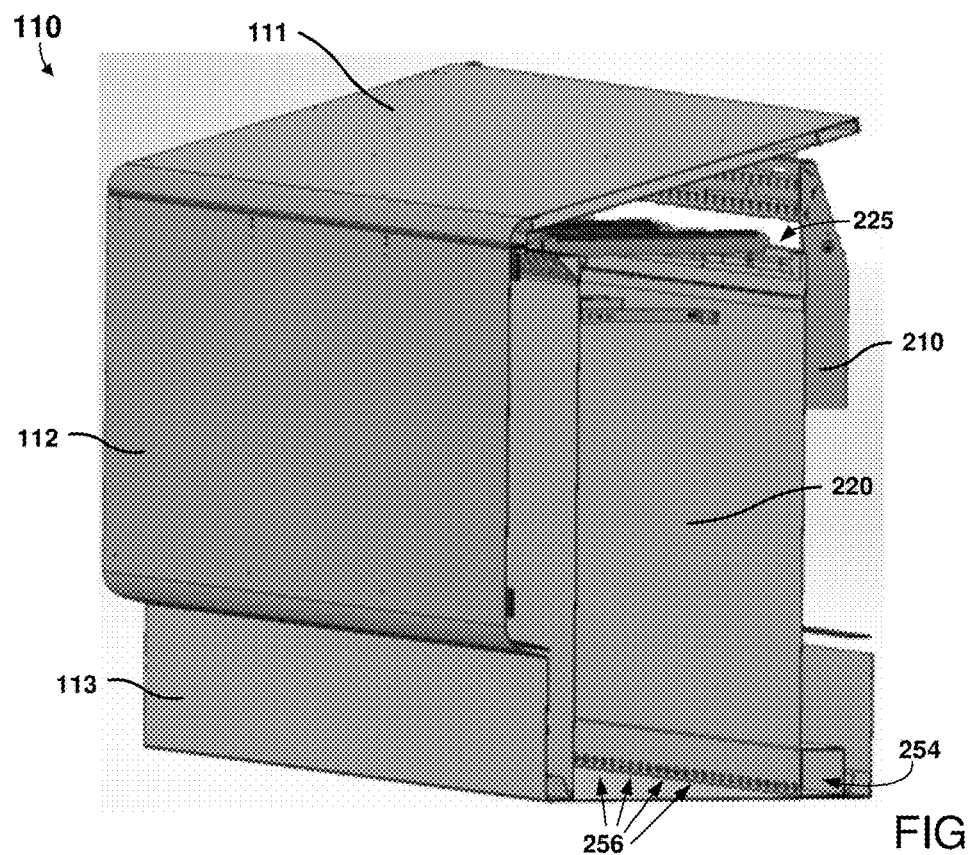
FIG. 4 is a perspective view of an immersion cooling rack with side-walls removed to reveal an inner portion of a main coolant tank, in accordance with various embodiments.

FIG. 4 is a perspective view of an immersion cooling rack with side-walls removed to reveal an inner portion of a main coolant tank, in accordance with various embodiments. In particular, FIG. 4 illustrates how the immersion cooling rack 210 may include a component coolant tank 220 that includes a series of inlet ports 256 along a bottom of a sidewall of the component coolant tank 220. Coolant fluid 50 flowing in the horizontally extending channel 254 will flow through the inlet ports 256 to fill the component coolant tank 220, eventually flowing over the weir 225 once the coolant fluid 50 level gets high enough. The inlet ports 256 may include nozzles or jets (not shown). The nozzles or jets may be adjusted to direct the orientation of the coolant fluid 50 to flow over a particular location or direction within the component coolant tank 220. For example, in instances where a computer component placed in the immersion cooling rack 210 is known to operate at a higher temperature, multiple inlet ports 256 may be adjusted to direct more coolant fluid 50 to flow over that hotter computer component. In other embodiments, the flow pressure from each inlet port 256 may be adjusted such that the coolant fluid 50 flow may be manipulated due to constructive and/or destructive wave interference of the coolant fluid 50 flow being directed through the inlet ports 256. Additionally, or alternatively, one or more of the inlet ports 256 may be fully constricted (i.e., closed), forcing the coolant fluid 50 to flow through the other inlet ports 256 that remain open, which may increase the pressure of the coolant fluid 50 passing through those open inlet ports 256.

In various embodiments, the immersion cooling rack 210 may include an outside panel 111 that is removable to provide access to electronic components, such as those mounted outside the component coolant tanks (e.g., see 215 in FIG. 1B).

Figure 5:
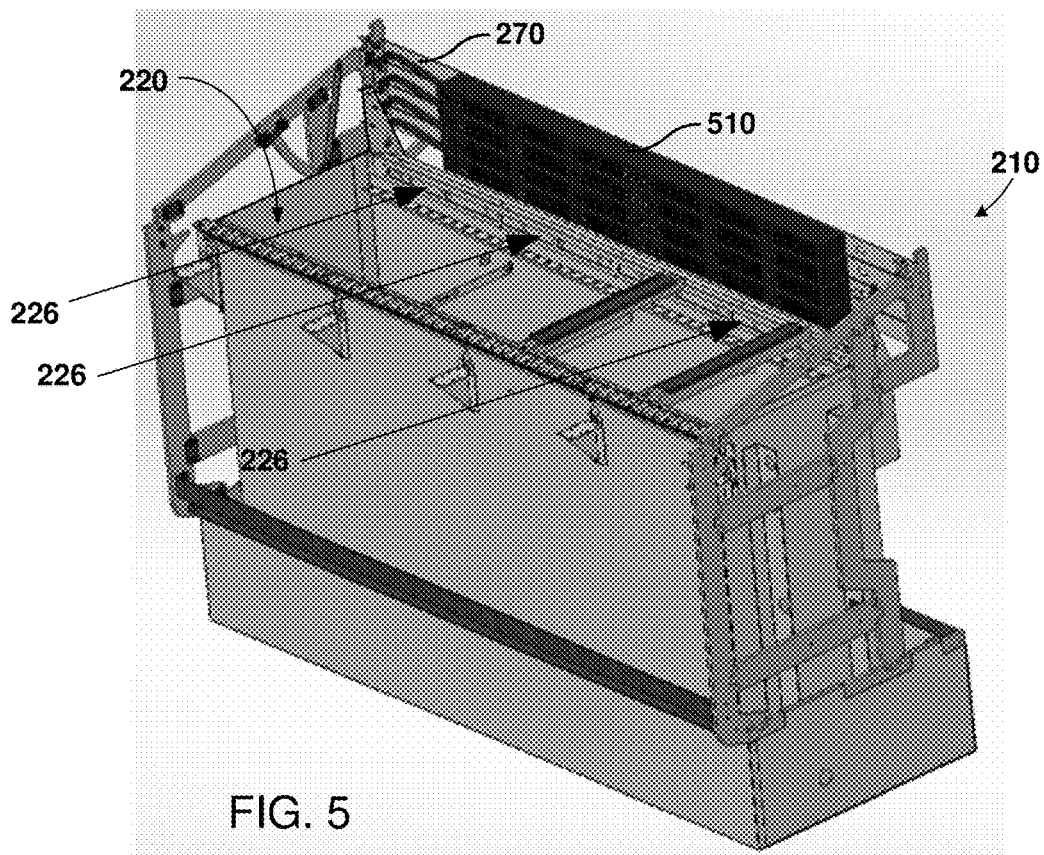
FIG. 5 is a perspective view of a front side of an immersion cooling rack with upper components removed to better show a weir used between the main and buffer coolant tanks and flow of coolant, in accordance with various embodiments.

FIG. 5 is a perspective view of a front side of the immersion cooling rack 210 with upper components removed to better show the weir 225 used between the component buffer tank 220 and the buffer coolant tank, in accordance with various embodiments. As shown, the immersion cooling rack 210 may also include additional component supports 270 configured to hold additional electronic components 510, which remain outside the coolant fluid 50 of either of the component coolant tank 220 and/or buffer coolant tank 230.

Figure 6A:
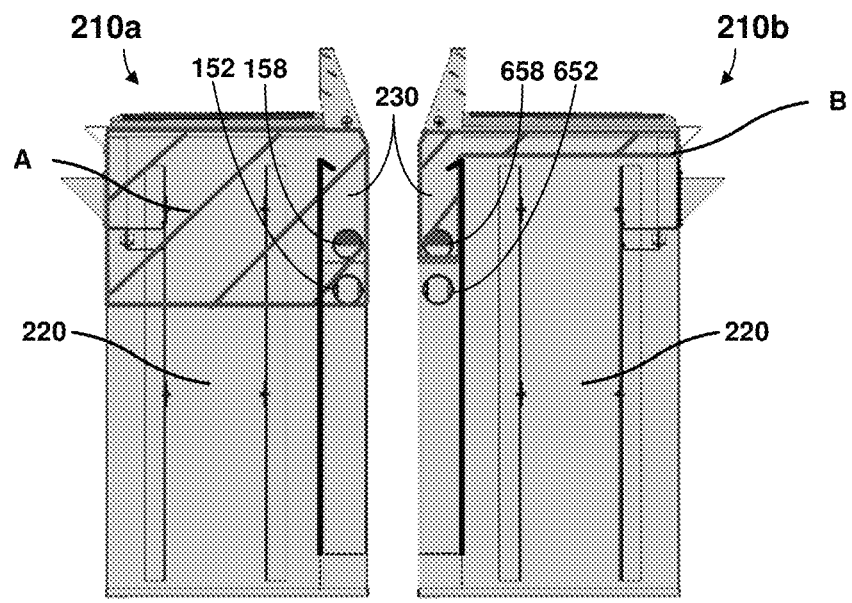
FIGS. 6A-6B are side cross-sectional views of adjacent pairs of immersion cooling racks with and without one-way valves, in accordance with various embodiments.
Figure 6B:
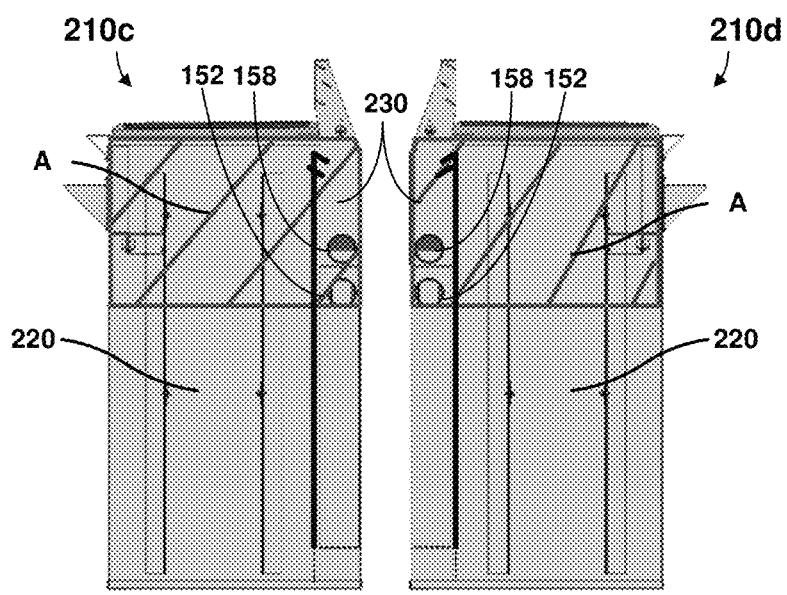

FIGS. 6A-6B are side cross-sectional views of adjacent pairs of electronic cooling racks with and without one-way valves, in accordance with various embodiments. FIG. 6A illustrates a first pair of immersion cooling racks 210a, 210b, one with unregulated ducts two-way valves 152, 158 and one with one-way valves 652, 658, such as check valves. In contrast, FIG. 6B illustrates a second pair of immersion cooling racks 210c, 210d both with ducts 152, 158.

The one-way valves 652, 658 may prevent coolant fluid 50 drainage from the immersion cooling racks 210a, 210b, particularly while being serviced. Including one-way valves 652, 658 may enable the ability to service the immersion cooling racks without losing coolant fluid 50 or requiring the coolant fluid 50 to be pumped from immersion cooling racks 210a, 210b below the level of the inlet/outlet ducts (152, 158) or valves (652, 658), which may minimize downtown resulting from having to resupply lost coolant fluid 50 or re-balancing available coolant fluid 50 across all the immersion cooling racks 210a, 210b. In particular, by using check valves for injection ports, drainage may be prevented. If a leak occurs in piping outside the immersion cooling racks 210a, 210b, the amount of coolant fluid 50 that will drain may be decreased significantly. The first cross-hatched area A represents the amount of coolant fluid 50 that would be lost, across immersion cooling racks 210a, 210b, if one of the ducts or connection thereto leaked or was disconnected. In contrast, the second cross-hatched area B shows a far smaller amount of fluid lost in the event of a leak or disconnection. The benefit of the one-way valve is that it makes integrated containment within a small space achievable since spill containment capacity needs to support the most common spill event and most common spill capacity, which will be minimized by the installed check valve.

Figure 7A:
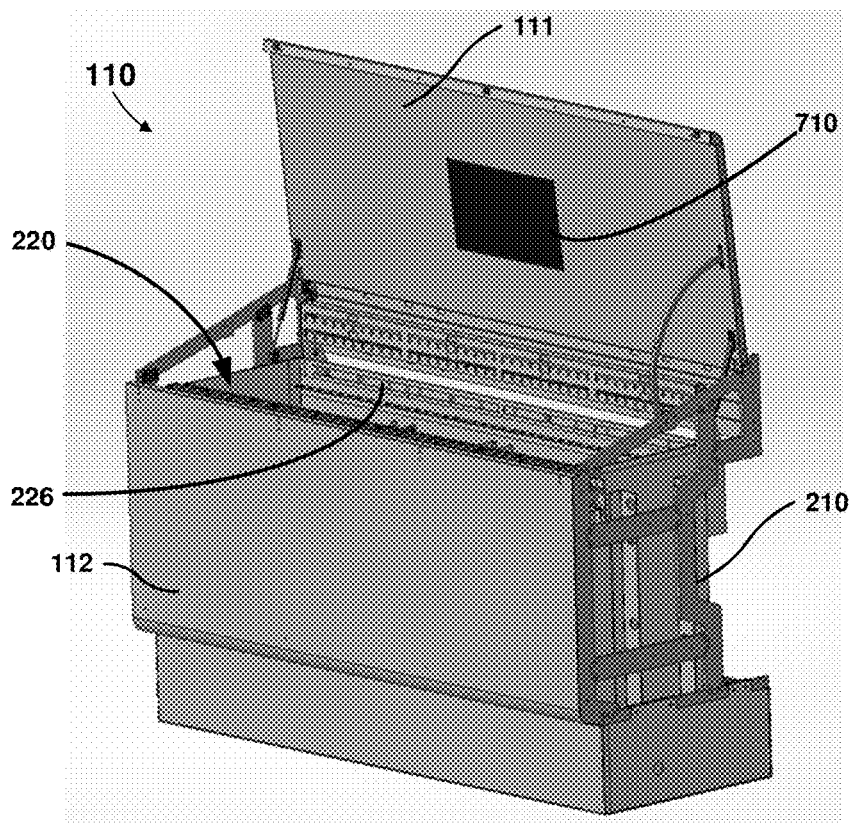
FIG. 7A is a right-side perspective view of an immersion cooling rack assembly with a video monitor.
Figure 7B:
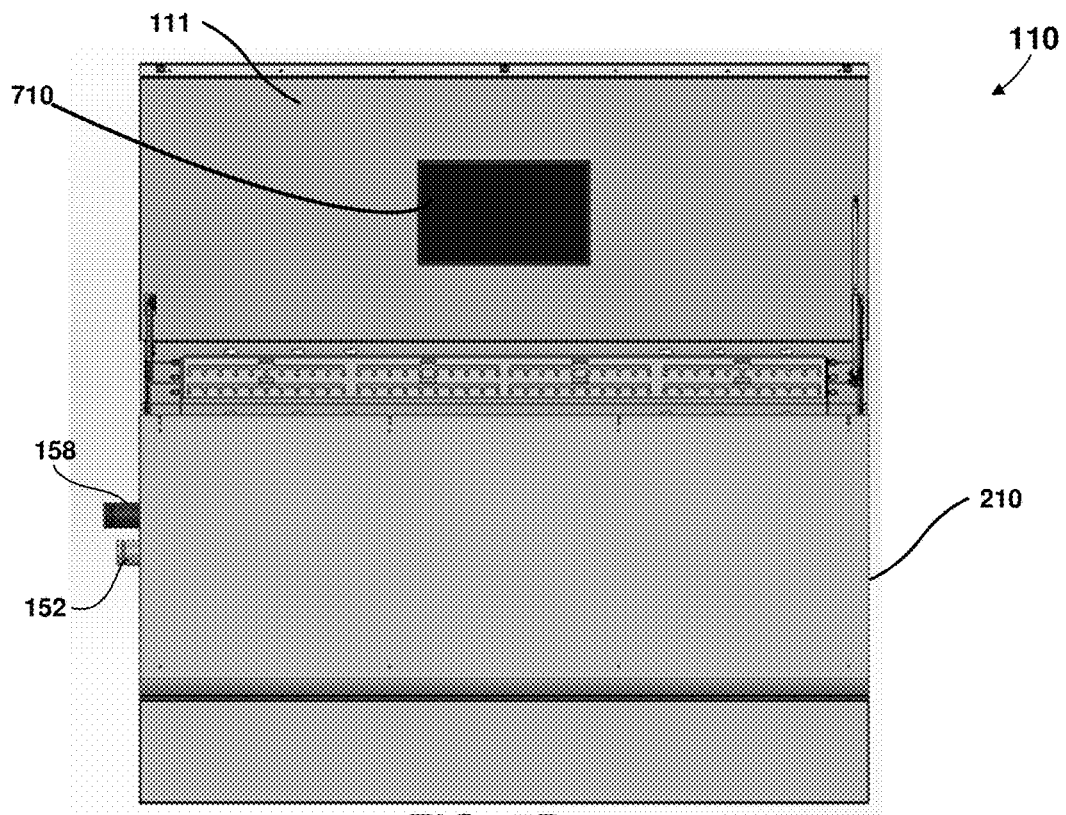
FIG. 7B is a front view of an immersion cooling rack assembly with a video monitor.
Figure 7C:
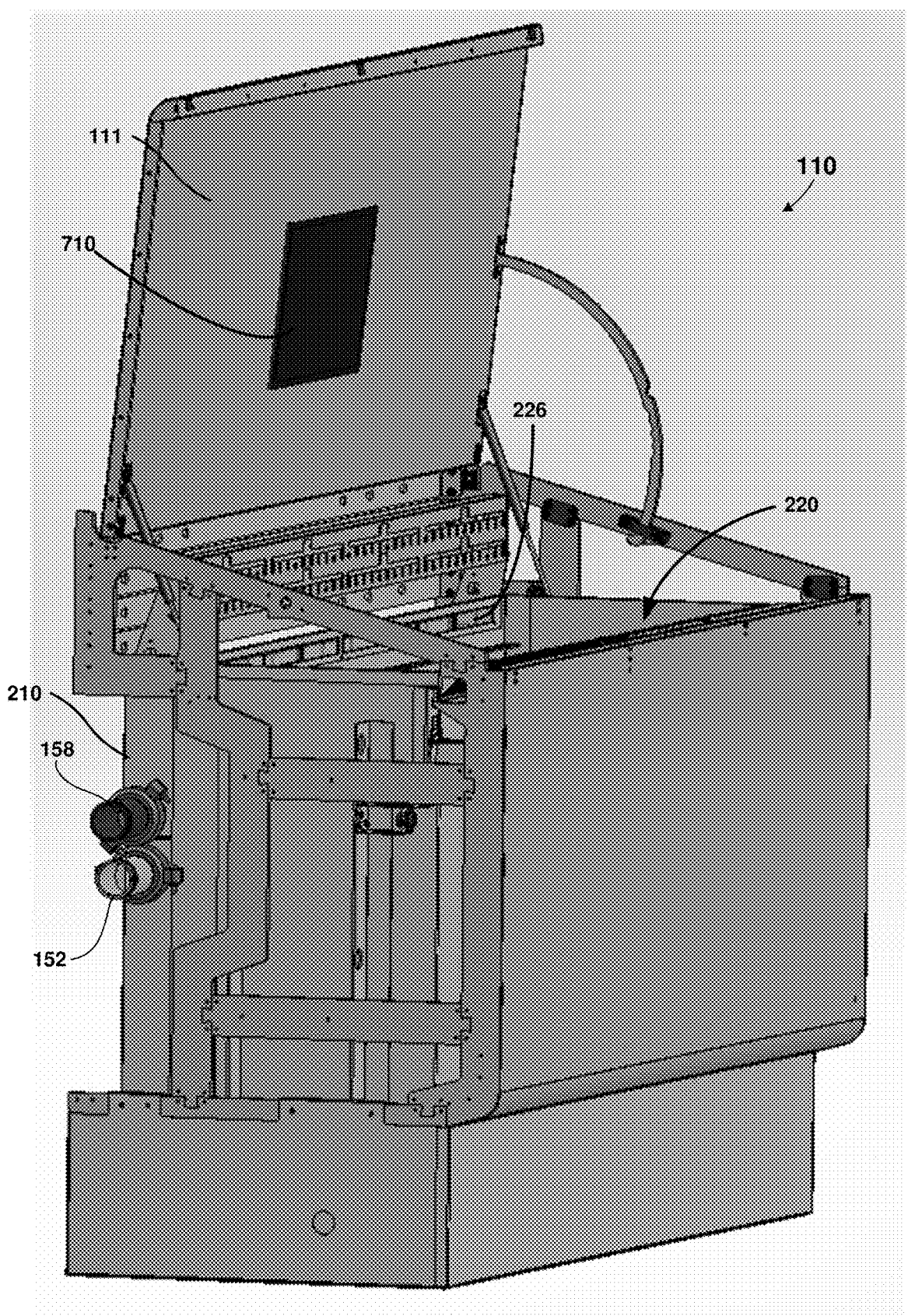
FIG. 7C is a left side perspective view of an immersion cooling rack assembly with a video monitor.

FIGS. 7A-7C are right side perspective, front, and left side perspective views of an immersion cooling rack assembly with a video monitor. The immersion cooling rack assembly 110 may include an upper panel 111 and an outside panel configured to enclose and/or cover the immersion cooling rack 210. The upper panel 111 may be configured to pivot from a closed position (see FIGS. 11C) to an open position (see FIGS. 7A-7C). In the open position, the upper panel 111 allows access to the main coolant tank 220.

In accordance with various embodiments, the upper panel 111 may include a video monitor 710. The video monitor 710 may be configured to provide a visual display of an operating status and/or conditions of the immersion cooling rack assembly. For example, the video monitor 710 may display readouts of conditions (e.g., fluid levels and/or temperatures) in the main coolant tank 220. Additionally, or alternatively, the video monitor 710 may be coupled to the electronic components inside and/or outside the main coolant tanks, for displaying an operating status and/or conditions thereof. The video monitor 710 may be helpful to technicians charged with maintaining the immersion cooling rack assembly 110, components therein, and/or the overall multi-rack cooling system 100.

The multi-rack cooling system 100 may include a control unit with one or more processor, memory, and software for controlling the multi-rack cooling system 100 or parts thereof. The control unit may include redundant power sources and a programmable logic controller (PLC). When a preferred power supply for the PLC is lost, a secondary power supply may be activated and/or the PLC may perform a restart of the control unit. When the preferred power supply resumes functioning, the PLC may experience a seamless transition back to the preferred power supply.

The control unit may determine when to transition to a secondary coolant circulating system, such as due to higher than desired coolant temperatures or primary coolant circulating system failure or errors. The PLC may have the ability to determine if/when the secondary coolant circulating system is functioning properly and take action to bring the primary coolant circulating system back on-line, if there is an issue with the secondary coolant circulating system, thus ensuring that the best possible function for the coolant circulatory system is achieved.

The PLC may also have the ability to detect issues with the primary coolant circulating system and switch to the secondary coolant circulating system during normal operation. Issues with the primary pump, a variable frequency drive (VFD) or primary power supply can be detected by analyzing the data returned to the PLC from the VFD along with other sensor data from the CDU, when certain VFD errors, combinations of VFD errors, sensor data, combinations of sensor data or a combination of VFD errors and sensor data occurs the PLC can transition to the secondary coolant circulating system to ensure that the best possible function for the coolant circulatory system is achieved. The VFD may be a motor drive used to vary the frequency and/or voltage of power going to an AC motor for the purposes of changing speed and torque.

When the control unit determines, for any reason, that a high temperature threshold has been reached (e.g., a thermostat reaches a trigger temperature) or that a secondary coolant circulating system is activated by breaking and making contacts using a relay. While the relay may make a connection to turn on the secondary pump it also may break a connection to a water valve, which may cause the water valve to open fully. This way of activating the secondary coolant system may reliably resolve some error states involving the water valve control and water valve actuator in the water circulation system. In addition, these systems may provide cross control between the two circulating systems, coolant, and water, all by the control unit, which may ensure that, regardless of the situation, both circulatory systems are functioning under either the primary or secondary control unit at any given time.

In various embodiments, multi-rack cooling lighting and/or logo backlighting may be utilized to deliver flash codes, alerts, or warnings to technicians by controlling the power thereto through the PLC.

The control unit may have security and access monitoring devices integrated into both the immersion cooling rack assemblies and/or the central distribution unit (e.g., 130). This may provide alerts regarding access, lock out tag out (LOTO), technician workflow tracking, security level access limitations, and limits customer/technician access to specific units in a collaborative environment, along with other capabilities yet to be specified.

The foregoing descriptions of systems, devices, and methods are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are used to guide the reader through the description of the methods. Further, any reference to claim elements in the singular, for example, using the articles "a," "an" or "the" is not to be construed as limiting the element to the singular.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A system for controlling temperature measured in multiple immersion cooling racks, comprising:
    a coolant distribution unit configured to adjust a temperature and pump a coolant fluid;
    a coolant manifold unit housing a coolant manifold for redistributing the coolant fluid;
    a supply line coupled to the coolant distribution unit and the coolant manifold, wherein the supply line is configured to convey the coolant fluid from the coolant distribution unit to the coolant manifold;
    a return line coupled to the coolant distribution unit and the coolant manifold, wherein the return line is configured to convey the coolant fluid from the coolant manifold to the coolant distribution unit;
    a first pair of immersion cooling racks interposed between the coolant distribution unit and the coolant manifold unit, wherein each immersion cooling rack of the first pair of immersion cooling racks is coupled to the coolant manifold through a first inlet duct for receiving the coolant fluid from the coolant manifold and a first outlet duct for returning the coolant fluid to the coolant manifold; and
    a second pair of immersion cooling racks disposed on an opposite side of the coolant manifold unit relative to the first pair of immersion cooling racks such that the coolant manifold unit is interposed between the first pair of immersion cooling racks and the second pair of immersion cooling racks, wherein each immersion cooling rack of the second pair of immersion cooling racks is coupled to the coolant manifold through a second inlet duct for receiving the coolant fluid from the coolant manifold and a second outlet duct for returning the coolant fluid to the coolant manifold.

2. The system of claim 1, wherein at least one of the first inlet duct or the first outlet duct in each immersion cooling rack is an adjustable valve configured to selectively restrict coolant fluid flow between the coolant manifold and the respective immersion cooling rack.

3. The system of claim 2, wherein each of the first pair of immersion cooling racks includes a thermal switch that is triggered when a temperature of the coolant fluid drops below a threshold temperature, wherein the triggering of the thermal switch restricts fluid flow through the adjustable valve.

4. The system of claim 1, wherein at least one of the first inlet duct or the first outlet duct in each immersion cooling rack is a one-way valve.

5. The system of claim 1, further comprising a plurality of inlet ports located in each of the first pair of immersion cooling racks, wherein the plurality of inlet ports are adjustable to control an orientation of a flow of coolant fluid through each respective immersion cooling rack.

6. The system of claim 5, wherein each of the plurality of inlet ports comprises an adjustable nozzle or jet to control the orientation of the flow of coolant fluid through each respective immersion cooling rack.

7. The system of claim 5, wherein each of the plurality of inlet ports comprises an adjustable coolant fluid valve to control the flow pressure of coolant fluid passing through the respective inlet port, wherein flow pressure controlled by the adjustable coolant fluid valve may constructively or destructively interfere with coolant fluid flow through adjacent inlet ports to control the orientation of the flow of coolant fluid through each respective immersion cooling rack.

8. The system of claim 1, wherein each of the first pair of immersion cooling racks comprises:
- a component coolant tank configured to hold at least one electronic component at least partially submerged in a coolant fluid pumped into the component coolant tank;
- a buffer coolant tank; and
- a weir extending along an upper edge of a barrier separating the component coolant tank from the buffer coolant tank, wherein the weir is configured to allow excess coolant fluid from the component coolant tank to spill out of the component coolant tank, over the weir, and into the buffer coolant tank.

9. The system of claim 8, wherein the coolant fluid is pumped into the component coolant tank from inlet ports along a bottom of a sidewall of the component coolant tank.

10. The system of claim 8, further comprising:
- a whirlpool shield mounted inside the buffer coolant tank above an outlet port for the coolant fluid to exit the buffer coolant tank, wherein a first end of the whirlpool shield is attached to a side wall of the buffer coolant tank and the whirlpool shield extends away from the first end toward a second end disposed further from the outlet port than the first end.

11. The system of claim 10, wherein the whirlpool shield extends downward at an angle such that the second end of the whirlpool shield is vertically lower than the first end of the whirlpool shield.

12. The system of claim 1, wherein at least one set of the first and second inlet ducts and the first and second outlet ducts are interposed between the first pair of immersion cooling racks and the second pair of immersion cooling racks.

* * * * *